United States Patent
Chan

(10) Patent No.: US 9,026,961 B2
(45) Date of Patent: *May 5, 2015

(54) RACE LOGIC SYNTHESIS FOR ESL-BASED LARGE-SCALE INTEGRATED CIRCUIT DESIGN

(71) Applicant: Terence Wai-Kwok Chan, Dublin, CA (US)

(72) Inventor: Terence Wai-Kwok Chan, Dublin, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/866,815

(22) Filed: Apr. 19, 2013

(65) Prior Publication Data

US 2014/0317582 A1    Oct. 23, 2014

(51) Int. Cl.
*G06F 17/50* (2006.01)

(52) U.S. Cl.
CPC .................... *G06F 17/505* (2013.01)

(58) Field of Classification Search
USPC .................................. 716/100–106
See application file for complete search history.

(56) References Cited

U.S. PATENT DOCUMENTS

| 6,292,931 | B1* | 9/2001 | Dupenloup | 716/104 |
| 6,581,191 | B1* | 6/2003 | Schubert et al. | 716/136 |
| 8,499,266 | B2* | 7/2013 | Chan | 716/108 |
| 2006/0117274 | A1* | 6/2006 | Tseng et al. | 716/1 |

* cited by examiner

*Primary Examiner* — Binh Tat

(57) ABSTRACT

Techniques for performing race logic synthesis on an integrated circuit (IC) are described herein. According to one aspect of the invention, ESL (electronic system level) and any HDL (hardware description language) design source files of an IC design are compiled into a design database. Race logic analysis is performed on the IC design to detect race logic, including race logic for IPC (inter-process communication) and IPS (inter-process synchronization) objects in the IC design, by a third-party tool and/or by the same host EDA (electronic design automation) tool that will be performing race logic synthesis on the IC design, if the latter has built-in race logic audit functions. Based on the race logic audit results, race logic synthesis is performed on the design database, and getting rid of all identified race logic in the IC design, including IPC- and IPS-related race logic. This renders the EDA tool can perform concurrent analysis of the IC design, via the race-free IC design database, using multi-CPU/core computers and the results will be the same as if the EDA tool had performed serial analysis of the IC design using a single-CPU/core computer. Another aspect of the invention is outputting the re-synthesized logic in the design database to new ESL/HDL source files. User may use these revised source files to analyze the IC design using any other third-party EDA tools.

41 Claims, 9 Drawing Sheets

```
1.  module test (input clk, output reg x)
2.      always @(posedge clk) x = 1;
3.  always @(clk) x = 0;
4.  endmodule
```

```
1.  module test (input clk, d, output integer x, y)
2.      always @(posedge clk) x = d;
3.  always @(clk) y = x;
4.  endmodule
```

```
1.  module test (input clk, fd, d, output x)
2.      always @(posedge clk) $read(fd,x);
3.      always @(clk) $write(fd,d);
4.  endmodule
```

Figure: 4

```
1.    module test (input clk,  output integer x, y)
2.        always @(posedge clk) x = $random;
3.        always @(clk) y = $random;
4.    endmodule
```

Figure 5

```
CA  S=test.x P=a.v,2, P=a.v,3
CAR S=test.x  P=a.v,2, P=a.v,3
CI S=test.fd P=a.v,2,$write P=a.v,3,$read
CI F=$random, P=a.v,2, P=a.v,3
```

Figure 6

```
1. module test (input clk,  output reg x)
2.    always @(posedge clk) x = 1;
3. always @(clk) x <= 0;
4. endmodule
```

Figure 7

```
1. module test (input clk,  output reg x)
2.     always @(clk) x = 0;
3. endmodule
```

Figure 8

```
1. module test (input clk,  output reg x)
2.    always @(clk)
3.       if (clk == 1) x = 1; else x = 0;
4. endmodule
```

Figure 9

```
1. module test (input clk, p,  output reg x)
2. always @(posedge clk, p) x = 1;
3. always @(negedge clk, p) x = 0;
4. endmodule
```

Figure 10

```
1.  module test (input clk, p, output reg x)
2.      always @(clk,p)
3.          if ($active(p)) x = 0;
4.          else if (clk==1) x = 1;
5.          else if (clk == 0) x = 0;
6.  endmodule
```
Figure 11

```
1.  module test (input clk, p, output reg x)
2.      always @(clk,p)
3.          if ($active(p)) x = 1;
4.          else if (clk==1) x = 1;
5.          else if (clk == 0) x = 0;
6.  endmodule
```
Figure 12

```
1.  module test (input clk, d3,d2,d1, output reg x,y);
2.      reg [31:0] ack;
3.  always @(posedge clk, p) begin
4.      ack = {d2,d1};  x = ack[0];
5.  end
6.  always @(posedge clk, p) begin
7.      ack = {d3,d2};  y = !ack[1];
8.  end
9.  endmodule
```
Figure 13

```
1.  module test (input clk, d3, d2, d1, output reg x,y)
2.      always @(posedge clk) begin
3.          reg [1:0] ack;
4.          ack = {d3,d2}; x = ack[0];
5.      end
6.      always @(posedge clk) begin
7.          reg [1:0] ack;
8.          ack = {d2,d1}; y = !ack[1];
9.      end
10. endmodule
```
Figure 14

```
1.  module test (input clk, d3,d2,d1,  output [2:0] y);
2.      assign   y[2] = d1;
3.      assign   y[1] = d2;
4.      assign   y[0] = d3;
5.  endmodule
```

Figure 15

```
1.  module test (input clk, d3,d2,d1,  output [2:0] y);
2.      assign   y = {d1, d2, d3};
3.  endmodule
```

Figure 16

```
1.  module test (input clk, d,  output integer x, y)
2.      always @(posedge clk) x <= d;
3.      always @(clk) y = x;
4.  endmodule
```

Figure 17

```
1.  module test (input clk, d,  output reg x, y)
2.      always @( clk) begin
3.          if (clk=='1') x = d; y = x; end
4.  endmodule
```

Figure 18

```
1.  module test (input clk, d,  output integer x, y)
2.      always @(clk) begin
3.          y = x; if (clk ==1) x = d;  end
4.  endmodule
```

Figure 19

```
1.  module test (input clk, d, p,  output reg x, y)
2.      always @(posedge clk, p) x = d;
3.      always @(negedge clk, p) y = x;
4.  endmodule
```

Figure 20

```
1.  module test (input clk, d, p, output reg x, y)
2.      always @(clk,p)
3.          if ($active(p)) begin
4.              x = d; y = x; end
5.          else if (clk==1)  x = d;
6.          else  if (clk == 0) y = x;
7.  endmodule
```

Figure 21

```
1.  module test (input clk, d, p, output reg x, y)
2.      always @(clk,p)
3.          if ($active(p))y = x;  x = d; end
4.          else if (clk==1)  x = d;
5.          else  if (clk == 0) y = x;
6.  endmodule
```

Figure 22

```
1.  module test (input clk, fd, d, output x)
2.      always @(clk) begin
3.          if (clk==1) $read(fd,x); $write(fd,d);
4.      end
5.  endmodule
```

Figure 23

```
1.  module test (input clk, fd, d, output x)
2.      always @(clk) begin
3.          $writr(fd,d); if (clk==1) $read(fd,x);
4.      end
5.  endmodule
```

Figure 24

```
1.  module test (input clk, p, fd, d output reg x)
2.      always @(posedge clk, p) x = $read(fd);
3.      always @(negedge clk, p) $write(fd,d);
4.  endmodule
```

Figure 25

```
1.  module test (input clk, p, fd, d, output reg x)
2.     always @(clk,p)
3.        if ($active(p)) begin
4.           x = $read(fd); $write(fd,d); end
5.        else if (clk==1)  x = $read(fd);
6.        else  if (clk == 0) $write(fd,d);
7.  endmodule
```

Figure 26

```
1.  module test (input clk, p,  output reg x)
2.     always @(clk,p)
3.        if ($active(p)) begin
4.           $write(fd,d);  x = $read(fd); end
5.        else if (clk==1)  x = $read(fd);
6.        else  if (clk == 0) $write(fd,d);
7.  endmodule
```

Figure 27

```
1.  module test (input clk,  output integer x, y)
2.     always @(clk) begin
3.        if (clk ==1) x = $random; y = $random;
4.     end
5.  endmodule
```

Figure 28

```
1.  module test (input clk,  output integer x, y)
2.     always @(clk) begin
3.        y = $random;  if (clk ==1) x = $random;
4.     end
5.  endmodule
```

Figure 29

```
1.  module test (input clk, p,  output integer x, y)
2.     always @(posedge clk, p) x = $random;
3.     always @(negedge clk,p) y = $random;
4.  endmodule
```

Figure 30

```
1.   module test (input clk, p,  output integer x, y)
2.       always @(clk, p)
3.       if ($active(p)) begin
4.            y = $random; x = $random; end
5.       else if (clk=='1') x = $random;
6.       else if (clk,=='0') y = $random;
7.   endmodule
```

Figure 31

```
1.   module test (input clk, p,  output integer x, y)
2.       always @(clk, p)
3.         if ($active(p))
4.            y = $random; x=$random; end
5.       else if (clk=='1') x = $random;
6.       else if (clk,=='0') y = $random;
7.   endmodule
```

Figure 32

```
1.   module a (input clk, d,  output reg x, y);
2.       always @(posedge clk) begin
3.         x = ~d; y = d; end
4.   endmodule
5.
6.   module b( input clk, d2, d3, output reg x, z);
7.       always @(clk) begin
8.            x = 0; z = d2 ^ d3; end
9.   endmodule
```

Figure 33

```
1.   module a (input clk, d,  output reg x, y);
2.       always @(posedge clk)  y = d;
3.       always @(clk)
4.            if (clk==1) x = ~d; else x =0;
5.   endmodule
6.
7.   module b( input clk, d2, d3, output reg x, z);
8.       always @(clk) z = d2 ^ d3;
9.   endmodule
```

Figure 34

```
1.  module a (input clk, d, output reg x, y);
2.      always @(posedge clk) begin
3.          x = ~d; y = d; end
4.  endmodule
5.
6.  module b( input clk, x, d3, output reg z);
7.      always @(clk) begin
8.          z = x ^ d3; end
9.  endmodule
```

Figure 35

```
1.  module a (input clk, d, output reg x, y);
2.      always @(posedge clk) begin
3.          y = d; end
4.  endmodule
5.
6.  module b( input clk, x, d3, output reg z);
7.      always @(clk) begin
8.          if (clk == 1)  x = top.i1.data;
9.          z = x ^ d3; end
10. endmodule
```

Figure 36

```
1.  module a(input clk, output integer x, y);
2.      always @(posedge clk) begin
3.          x = $random; y = x; end
4.  endmodule
5.  module b(input clk, d, output integer z, w);
6.      always @(clk) begin
7.          z = $random; w = d +1; end
8.  endmodule
```

Figure 37

```
1.  module a(input clk, output integer x, y);
2.      always @(clk) begin
3.          if (clk ==1) begin
4.              x = $random; y = x; end
5.          top.i1.zdata = $random; end
6.  endmodule
7.  module b(input clk, d, output integer z, w);
8.      always @(clk)
9.          w = d + 1;
10. Endmodule
```

Figure 38

```
1.  module a(input clk, d1, fd, output integer x, y);
2.     always @(posedge clk) begin
3.        x = $read(fd); y = d1; end
4.  endmodule
5.  module b(input clk, d, d2 fd, output integer w);
6.     always @(clk) begin
7.        $write(fd,d); w = d2 +1; end
8.  endmodule
```

Figure 39

```
1.  module a(input clk, d1, fd, output integer x, y);
2.  always @(clk) begin
3.     if (clk ==1) then begin
4.        x = $read(fd); y = d1; end
5.     $write(fd,top.i1.data); end
6.  endmodule
7.  module b(input clk, d, d2 fd, output integer w);
8.     always @(clk) begin
9.        w = d2 +1; end
10. endmodule
```

Figure 40

RACE LOGIC SYNTHESIS FOR ESL-BASED LARGE-SCALE INTEGRATED CIRCUIT DESIGN

RELATED APPLICATIONS

This application is a continuation of U.S. patent application Ser. No. 13/167,237, filed on Jun. 23, 2011, which claims the benefits of U.S. Provisional Patent Application No. 61/359,027, filed on Jun. 30, 2010. The disclosure of the above-identified application is incorporated by reference herein in its entirely.

FIELD OF THE INVENTION

This present invention relates generally to integrated circuit designs. More particularly, this invention relates to computer-aided integrated circuit designs with race logic synthesis.

1. INTRODUCTION

With rapid advances of semiconductor process technologies, large-scale IC (integrated circuit) chips now contain hundreds of billions of logic gates, and their density is growing exponentially. Most of these new IC chips are ASIC (Application Specific Integrated Circuit), FPGA (Field Programmable Gate Array), SoC (System-on-Chip) and custom IC designs. Most of the advanced IC designs employ off-the-shelf intellectual property (IP) blocks from different vendors that are stitched together to form new designs. This practice of reusing pre-verified IP blocks saves new IC products development times and costs, and shortens time to market. Most IC designs are coded in HDL (Hardware Description Language) and/or ESL (Electronic System Level) languages. Examples of HDL are VHDL (Very high speed integrated circuit Hardware Description Language) and Verilog, which have been standardized by the IEEE (Institute of Electronic and Electrical Engineering) society as std-1076 and std-1364, respectively. Examples of ESL languages are SystemVerilog and SystemC, and they have also been standardized by the IEEE as std-1800 and std-1666, respectively. Furthermore, HDL/ESL verification tools, like static timing analyzers, logic simulators and formal verification tools are commonly employed by IC designers to verify their new IC circuits' functionalities and timings, prior to tape-out of their designs. Due to the increasing complexity and density of large-scale IC designs, functional verification of advanced IC designs now represents over 70% of a new product development time, and it will get worse as the semiconductor process technology continues to advance further in deep submicron scale (e.g., 20 nm and below).

To accelerate the verification of nanometer-scale IC circuits, multithreaded/multi-CPU HDL/ESL EDA (Electronic Design Automation) tools are now available to aid IC designers to significantly reduce their IC development time by an order of magnitude or more. Table 1 lists some commercially available HDL/ESL logic simulators that can run on multi-CPU/core computers.

TABLE 1

List of Commercial Multi-CPU/core HDL/ESL Simulators

| Product Name | Vendor | HDL/ESL language supported |
|---|---|---|
| V2Sim | Dynetix Design Solutions Inc | Verilog, VHDL, SystemVerilog, SystemC |
| VCS-Multicore | Synopsys Inc | Verilog, VHDL, SystemVerilog, SystemC |
| Questa | Mentor Graphics Inc | Verilog, VHDL, SystemVerilog, SystemC |
| MPSIM | AXIOM Design Automation Inc | Verilog, SystemVerilog, SystemC |

Due to the increasingly common practice of integrating IP blocks from different sources to speed-up the development of a new IC, race logic will inevitably be introduced into the IC circuit. Race logic is any logic circuitry that behaves differently when it is being executed in different order. Race logic is described in detailed in the RACE LOGIC DESCRIPTION AND RACE LOGIC AUDIT TOOLS section. If race logic is not detected and eliminated in an IC circuit, it will cause an EDA tool's analysis results on a 1-CPU computer to be different from that by the same tool for the same circuit on multi-CPU/core computers. Added to that, the multi-CPU/core analysis results for the same IC design by the same EDA tool may be different across different runs, due to parallel events/logic are being evaluated in different order in different runs. Furthermore, the presence of race logic may cause the corresponding IC chips to manifest intermittent failures on the field and may render product recalls. Thus, race logic in IC designs must be detected and eliminated, to ensure that any HDL/ESL EDA tools, on 1- or multi-CPU/core computers, can consistently verify the design and the corresponding IC chips will not manifest intermittent failures in the field.

However, if race logic is in third-party IP blocks, then IC designers cannot fix the race logic in those IP's. Thus, it is important that all race logic in a compiled design database for an IC circuit be detected, and that they can be automatically be eliminated by the EDA tool. This is to ensure the EDA tool's 1- and multi-CPU analysis results for the IC are the same, so that IC designers can use the multithreaded EDA tool to accelerate the analysis/verification of the IC designs and reduce time to market of their new ICs.

This invention describes a set of state-of-the-art race logic synthesis technologies that can re-synthesize and eliminate race logic in a compiled IC design database that is created by an EDA tool. The EDA tool may be a multithreaded/multi-CPU HDL/ESL logic simulator. The technologies do not detect race logic, as there are already a host of commercial HDL/ESL race logic analysis tools that can detect race logic (see Table 2). Thus the technologies described herein expect the race logic information for an IC design-under-test is provided by either user or by the host EDA tool.

TABLE 2

Commercial Race Logic Audit Tools

| Product | Vendor | Race Logic Analysis | Simulation | Detect ESL Race Logic |
|---|---|---|---|---|
| RaceCheck | Dynetix Design Solutions Inc | Static, dynamic | Yes | Yes |
| V2Sim | Dynetix Design Solutions Inc | Static | Yes | Yes |
| Spyglass | Altrenta Inc | Static | No | No |
| Blue Pearl | Blue Pearl Software Inc | Static | No | No |
| VCS | Synopsys Inc | Static, dynamic | Yes | No |

Note that whereas logic synthesis refers to technology that maps an IC design's behavioral and/or register transfer level (RTL) logic to gate-level logic, the race logic synthesis technology described herein does not map an IC design's behavioral/RTL logic to gate-level logic, rather it replaces an IC design behavioral/RTL logic that have race issues with an equivalent but race-free behavioral/RTL logic. Furthermore, the race logic synthesis technology can be incorporated into any kind of EDA design and/or verification tools, such as HDL/ESL logic synthesis, logic simulators, fault simulators, automatic test generation tools, static timing analyzers and formal verification tools.

The race logic synthesis technologies can be incorporated into any single- or multi-threaded EDA tool, such as HDL/ESL multithreaded logic simulators or fault simulators. FIG. 1 depicts the process flow of the verification of a large-scale IC by an EDA tool that can perform race logic synthesis. Specifically, the tool compiles the IC design's HDL/ESL source files and creates a design database. Race logic audit results for the IC design are either provided by users to the EDA tool, or they can be automatically generated by the tool's built-in race logic audit function (if available). The race logic synthesis functions that are incorporated in the tool are then invoked to re-synthesize and eliminate the race logic in the compiled design database. As a user option, the modified logic may be output to one or more HDL/ESL source files for users to review. After all the aforementioned processes are performed, the EDA tool may then perform analysis/verification of the IC design, based on the re-synthesized design database, on either 1- or multi-CPU/core computer.

As an alternative to the above, the race logic synthesis technologies can be made into a stand-alone tool that will compile an IC design and create a design database, obtain race logic information of the IC design from user, then perform race logic synthesis on the design database to eliminate the race logic. In the end, the tool will output the modified IC logic to one or more HDL/ESL source files. User may then use those re-synthesized HDL/ESL source files to verify the race-free IC design using any third-party EDA verification tools.

In the following description, a "host" EDA tool is the EDA tool that incorporates the race logic synthesis functions. Moreover, the tool compiles an IC design source files and creates a design database, and then it invokes the race logic synthesis functions to resolve race logic in the database. A "target" EDA tool is an EDA tool that performs the similar design/verification functions as the host EDA tool. The target EDA tool could be the host EDA tool, or a similar tool from a third party vendor. The target EDA tool's 1-CPU analysis results for an IC design are the reference that the race logic synthesis functions will be based on to re-synthesize an IC design database. The modified design database will render the host EDA tool to produce the same analysis results as the target EDA tool for the IC design, on multi-CPU/core computers. The choice of the target EDA tool can be specified by user to the host EDA tool.

In the following sections, section 2 describes all the figures for this invention. Section 3 describes the race logic commonly found in IC designs, and the commercial tools that can audit the race logic. Section 4 depicts the invention's technologies in detail. The final section depicts the claims for the race logic synthesis technologies.

2. BRIEF DESCRIPTION OF FIGURES

The present invention is illustrated by way of example and not limitation in the figures of the accompanying drawings in which like references indicate similar elements.

FIG. 1 shows the process flow of compiling an IC design's HDL/ESL source files into a design database by a host EDA tool. Race logic audit results for the IC design are fed to the race logic synthesis functions that are built-in to the EDA tool. The race logic synthesis functions re-synthesize and eliminate all the identified race logic in the IC design database, the host EDA tool then performs analysis on the race-free design database and output the analysis results to user. Furthermore, per user request, the re-synthesized logic could be written out by the race logic synthesis functions to new HDL/ESL source files.

FIG. 4 shows the first example of concurrent invocation race logic.

FIG. 5 shows the first example of concurrent invocation race logic with the Verilog $random system function.

Figures 1, 2, 3:
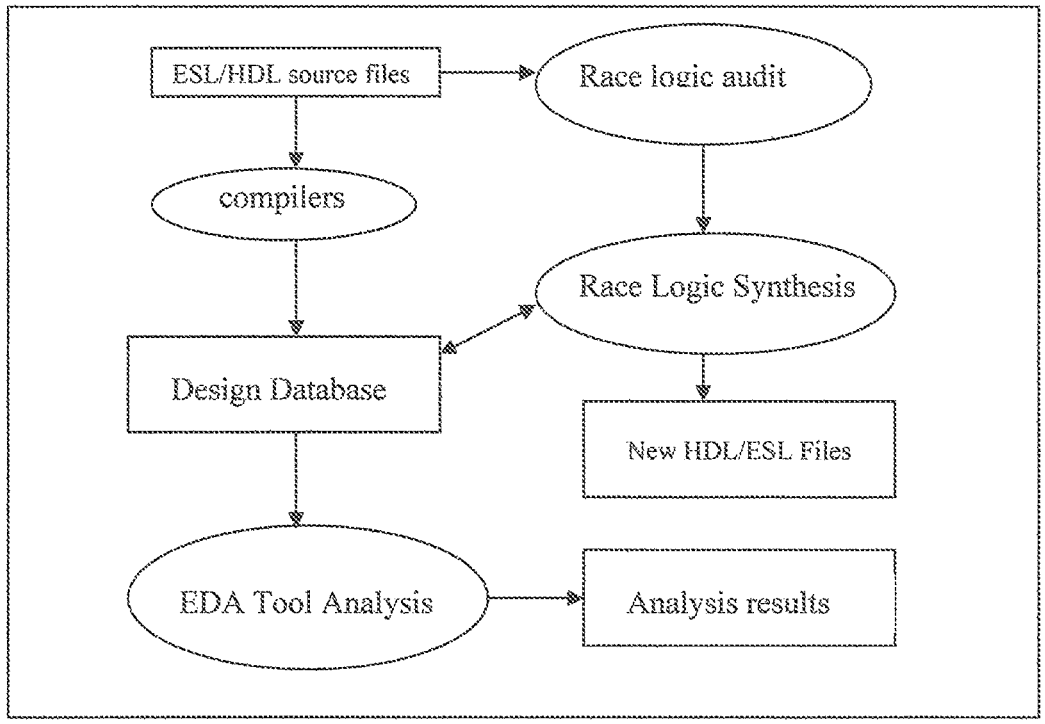
FIG. 2 shows the first example of concurrent assignment race logic.
FIG. 3 shows the first example of concurrent assignment and reference race logic.

FIG. 6 shows example of data records that contain identified race logic information for an IC design. The data record may be generated by a third party race logic audit tool. The host EDA tool parses these data records and sends the race logic data to the race logic synthesis functions for resolution. The race logic synthesis functions are incorporated into the host EDA tool.

FIG. 7 shows the first example of the elimination of concurrent assignment race logic as depicted in FIG. 2.

FIG. 8 shows the second example of the elimination of concurrent assignment race logic as depicted in FIG. 2.

FIG. 9 shows the third example of the elimination of concurrent assignment race logic as depicted in FIG. 2.

FIG. 10 shows the second example of concurrent assignment race logic involving the posedge and negedge of a signal clk.

FIG. 11 shows the re-synthesized logic for the logic depicted in FIG. 10 that has no concurrent assignment race. This is for a target EDA tool that executes event blocks in the same order as they are specified in the HDL/ESL source files.

FIG. 12 shows the re-synthesized logic for the logic depicted in FIG. 10 that has no concurrent assignment race. This is for a target EDA tool that executes event blocks in the reverse order as they are specified in the HDL/ESL source files.

FIG. 13 shows the third example of concurrent assignment race where a signal ack is being assigned and then referenced in two different process blocks concurrently.

FIG. 14 shows the re-synthesized logic for FIG. 13, where the signal ack is duplicated in each of its two driving process blocks to eliminate the concurrent assignment race logic.

FIG. 15 shows the fourth example of concurrent assignment race logic, where three continuous assignment statements drive non-overlapping bits of signal y.

FIG. 16 shows the re-synthesized logic of that of FIG. 15 where the three concurrent drivers for signal y are being replaced by a single concurrent assignment statement. The new logic has no concurrent assignment race issue.

FIG. 17 shows the first example of the elimination of concurrent assignment/reference race logic as shown in FIG. 3, where the assignment to signal x in the process block at line 2 has been changed to non-blocking assignment type. This renders the assignment of signal x is always performed after it has been referenced by the process block at line 3 in FIG. 3.

FIG. 18 shows the second example of the elimination of concurrent assignment/reference race logic as shown in FIG. 3, where a target EDA tool executes event blocks in the same order as they are specified in the HDL/ESL source files.

FIG. 19 shows the third example of the elimination of concurrent assignment/reference race logic as shown in FIG. 3, where a target EDA tool executes event blocks in the reverse order as they are specified in the HDL/ESL source files.

FIG. 20 depicts another example of concurrent assignment/reference race logic where the triggering signals are clk and p.

FIG. 21 shows the elimination of concurrent assignment/reference race logic as shown in FIG. 20, where a target EDA tool executes event blocks in the same order as they are specified in the HDL/ESL source files.

FIG. 22 shows another example of eliminating concurrent assignment/reference race logic as shown in FIG. 20, where a target EDA tool executes event blocks in the reverse order as they are specified in the HDL/ESL source files.

FIG. 23 shows an example of elimination of the concurrent invocation race logic as depicted in FIG. 4.

FIG. 24 shows an alternative example of elimination of concurrent invocation race logic as depicted in FIG. 4.

FIG. 25 shows the second example of concurrent invocation race where the event blocks are triggered by the signals clk and p.

FIG. 26 shows the elimination of concurrent invocation race for the logic depicted in FIG. 25, and where a target EDA tool executes event blocks in the same order as they are specified in the HDL/ESL source files.

FIG. 27 shows an alternative method for elimination of concurrent invocation race for the logic as depicted in FIG. 25, and where a target EDA tool executes event blocks in the reverse order as they are specified in the HDL/ESL source files.

FIG. 28 shows the first example of the elimination of concurrent invocation race logic involving the Verilog $random system function as depicted in FIG. 5.

FIG. 29 shows the second example of the elimination of concurrent invocation race logic involving the Verilog $random system function as depicted in FIG. 5.

FIG. 30 shows the second example of concurrent invocation race for the Verilog $random system function.

FIG. 31 shows the first example of the elimination of concurrent invocation race logic as depicted in FIG. 30, where a target EDA tool executes event blocks in the same order as they are specified in the HDL/ESL source files.

FIG. 32 shows the second example of the elimination of concurrent invocation race logic as depicted in FIG. 30, where a target EDA tool executes event blocks in the reverse order as they are specified in the HDL/ESL source files.

FIG. 33 shows an example of two event blocks that render concurrent assignment race for signal x, and they also drive signals y and z. The two event blocks can be re-synthesized to get rid of the concurrent assignment race logic.

FIG. 34 shows the race logic synthesis results of the modules as depicted in FIG. 33 that have no concurrent invocation race logic. The new modules can be written out to a HDL/ESL FIG. 35 shows an example of two event blocks that render concurrent assignment and reference race logic for signal x, and they also drive signals y and z. The two event blocks can be re-synthesized to get rid of the concurrent assignment and reference race logic.

FIG. 36 shows the race logic synthesis results of the modules as depicted in FIG. 35 that have no concurrent assignment and reference race logic. The new modules can be written out to a HDL/ESL file.

FIG. 37 shows the third example of two event blocks that render concurrent invocation race of the Verilog $random system function. The two event blocks can be re-synthesized to get rid of the concurrent invocation race logic.

FIG. 38 shows the race logic synthesis results of the modules as depicted in FIG. 37 that have no concurrent invocation race of the Verilog $random system function. The new modules can be written out to a HDL/ESL file.

FIG. 39 shows an example of two event blocks that render concurrent invocation race for an IO stream. The two event blocks can be re-synthesized to get rid of the concurrent invocation race logic.

FIG. 40 shows the race logic synthesis results of the modules as depicted in FIG. 39 that have no concurrent invocation race for an IO stream. The new modules can be written out to a HDL/ESL file.

3. RACE LOGIC DESCRIPTION AND RACE LOGIC AUDIT TOOLS

Race logic is any logic circuitry in an IC design that behaves differently when it is being executed in different order. The most common kinds of race logic found in IC designs are:

Concurrent assignment race logic
Concurrent assignment and reference race logic
Concurrent invocation race of user- or, system-defined functions/tasks that may concurrently modify/reference one or more system resources (e.g., IO streams) or global variables Refer to FIG. 2 for an example of concurrent assignment race logic. Note that when the signal clk in FIG. 2 changes state from '0' to '1', both event blocks at line 2 and line 3 are active, and the signal x is assigned a '1' and a '0' value simultaneously. Thus, the actual value assigned to x is depending on which event block is executed last.

Refer to FIG. 3 for an example of a concurrent assignment and reference race logic. Note that when the signal clk changes state from '0' to '1', if the event block at line 2 is executed before the event block at line 3, signal y will get the incremented value of signal x. However, if the event block at line 3 is executed prior to that of event block at line 2, then signal y will be assigned the non-incremented value of x. Thus, the actual value assigned to y is in-determinant.

Refer to FIG. 4 for an example of a concurrent invocation race of user- or system-defined functions/tasks. Note that the two event blocks in FIG. 4 may perform concurrent read and write of data to the same file, via the same file descriptor fd. The result is in-determinant data are being read from and written to the file.

Refer to FIG. 5 for another example of a concurrent invocation race of user- and system-defined functions/tasks. In this example, the Verilog system function $random is called to return a random integer value. The $random function modifies a system-defined global variable seed at each invocation, so that the return values for subsequent invocations of the $random function will be different values. However, if the two event blocks in FIG. 5 are active at the same time and concurrently call the $random function, the values assigned to the signal x and y are in-determinant.

There are commercial HDL/ESL analysis tools and HDL/ESL simulators that can audit race logic. These tools are described in Table 2. Note that all the tools depicted in Table 2 can perform static race logic analysis on IC designs. This means the tools can detect all possible race logic in an IC design based on the logic information in the design database. No test vector is needed, and logic simulation is not performed in the static race logic analysis. The drawback of this approach is some race logic identified may not actually be manifested in real life operations of IC chips. Hence some static race logic audit results may be false positive. Two tools depicted in Table 2 (RaceCheck and VCS) can also perform dynamic race logic analysis. These tools perform logic simulation on an IC design, based on test vectors provided by IC designer or verification engineer, and they report all race logic detected throughout the simulation. The advantages of dynamic race logic analysis are: it reports only detectable race logic in an IC design, and the simulation time when race logic occurs. Thus dynamic race logic analysis yields more accurate results than static race logic analysis. However, the dynamic race logic analysis drawbacks are: long analysis time and their result accuracy is dependent on the quality of the user-supplied test vectors.

3.1 ESL-Specific Race Logic

ESL languages like SystemVerilog and SystemC provide inter-process communication (IPC) and inter-process synchronization (IPS) objects to aid IC designers describing system-level operations of their circuits. IPC objects are used to pass data among design processes. They include but not limited to FIFO (First-In-First-Out) buffers, mailboxes and dynamic queues. IPS objects are used to synchronize the operations of multiple IC design processes, such as imposing serial access to global system resources (e.g., file streams and global registers). IPS objects include but not limited to semaphores and mutexes.

If in an IC there are only one writer design process and one reader design process using a same IPC object such as a FIFO buffer or a mailbox, then no race logic will incur. However, if there are multiple design processes concurrently writing to and/or reading from a same IPC object, then the order of data being written to and/or read from the IPC object will be indeterminate respectively, and these render race logic.

For a dynamic queue object, its size and content are changed whenever a design process adds or deletes data to and from the queue, respectively. Thus, if two or more design processes concurrently write to and read from a dynamic queue, race logic will occur as it will be indeterminate of what data is being read from the dynamic queue. Furthermore, concurrent write to or delete from the same location of a dynamic queue will render race logic, as it is indeterminate of what data is actually written to, or delete from the specified location of a dynamic queue, respectively. The operations of a dynamic queue should be controlled by an IPS object to ensure that only one process may manipulate the dynamic queue at any given time.

An IPS object, such as a mutex or a semaphore, is used to synchronize the operations of multiple design processes. Specifically, a semaphore contains an integer value that is set to zero when an IC circuit begins operation. Any design process that performs a lock operation (via the "get" (blocking) or "tryget" (non-blocking) built-in method of semaphore) on a semaphore will attempt to decrement the semaphore's value by one, and that design process will be blocked (its execution suspended) if its lock operation will render the semaphore' value to go below zero. The design process will proceed with its execution if its lock operation will render the semaphore's value to be greater than or equal zero; otherwise the design process will be blocked until another design process performs an unlock operation (via the "put" built-in method of semaphore, which will increment the semaphore's value by one) on the semaphore so that the former process's lock operation can succeed. A semaphore's value may be any natural number that is greater than or equal to zero. If there are N design processes that are blocked waiting on a semaphore, another design process may set the semaphore's value to M, where M<=N, and M waiting processes will be unblocked.

A mutex is like light switch such that it is in either a lock or unlock state. If multiple design processes try to lock a same mutex concurrently, only one of those design processes will succeed, and the other design processes will either be blocked or obtained a failure return status if they use the "lock" (blocking) or "trylock" (non-blocking) built-in method of mutex, respectively. A mutex can only be unlocked by a design process that has locked it, and the "unlock" built-in method call by that design process will unblock one of the waiting design processes of that mutex. The unblocked design process will now lock the mutex, and it will in-turn unlock the mutex when it is done accessing some shared system resource.

Race logic occurs for an IPS object when multiple design processes concurrently trying to lock an IPS object, as it is indeterminate of which design process will succeed. Furthermore, if any of those design processes will assign new values to one or more signals and/or registers once those design processes succeed in locking the IPS object, it will be indeterminate of when those assignments will occur. Moreover, once the IPS object is unlocked, it is indeterminate of the order of which design process (or processes) waiting on the IPS object will be "unblocked" and resume execution.

Finally, note in Table 2, currently only the RaceCheck and V2sim products from Dynetix Design Solutions Incorporate are capable of detecting ESL IPC and IPS race logic. All other race logic audit tools, as offered by other EDA vendors, do not detect ESL IPC and IPS race logic.

4. DESCRIPTION OF PRIOR ARTS

Race logic has been overlooked by most IC designers, and most HDL/ESL design verification tools, like logic simulators and formal verification tools, do not audit race logic. Static timing analyzers perform setup and hold timing checks, which are a form of detecting concurrent assignment and reference race logic, but they do not check for other types of race logic.

IC designers and verification engineers traditionally handle race logic by running race logic audit tools on the new IC circuits, and they manually fix any identified race logic in their circuits. This approach fails when race logic is in third party IP blocks, and that IC designers cannot fix the IP's due to either they have no authority to do so or the IP blocks are encrypted by the IP vendors.

There has been no published works on race logic synthesis of IC designs. Thus, this invention is the first of its kind to describe a set of technologies that can directly fix identified race logic in an EDA tools' compiled design database for an IC circuit. The EDA tool could be a HDL/ESL simulator, a formal verification tool or a static timing analyzer. The technologies are applicable for any IC designs, such as ASIC, SoC, FPGA and custom IC. Furthermore, the technologies can be incorporated into different types of IC design and verification tools, which use different proprietary database formats.

Finally, there have been no published works on directing the race logic synthesis functions to write out re-synthesized, race-free IC logic to new HDL/ESL source files, so that users may use that to verify their IC designs using third party verification tools.

5. DETAILED DESCRIPTION OF THE INVENTION

FIG. 1 depicts the process flow of an EDA tool that has incorporated the race logic synthesis functions. Specifically, the tool may run on any one- or multi-CPU/core computer, that runs operating systems including, but no limited to Linux, UNIX, or Windows.

The EDA tool may support IC designs coded in one or a plurality of hardware design languages, including but not limited to Verilog, VHDL (VHSIC Hardware Description Language), SystemVerilog, SystemC, Property Specification Language (PSL), OpenVera, C and C/++. For each IC circuit to be verified, the tool compiles the IC design source files into a proprietary design database. The IC design is then audited for race logic, either by a third party race logic analysis tool or by the host EDA tool itself—if the latter has built-in race logic audit functions. The detected race logic information for the IC circuit is passed on to the race logic synthesis functions that are built-in to the host EDA tool. The race logic synthesis functions re-synthesize the identified race logic in the design database to resolve all the race issues. After that, the host EDA tool can carry out analysis/verification of the IC design based on the modified design database.

Race logic in the IC may be detected by a third party race logic audit tool, or by the host EDA tool. If a third party race logic audit tool is used, the identified race logic are depicted in a textual report file, and the host EDA tool will provide a parser to extract the race logic data from the report file into binary data that are passed on to the race logic synthesis functions. On the other hand, if the host EDA tool can detect race logic of an IC design by itself, then the identified race logic data are passed directly to the race logic synthesis functions from the host EDA tool.

FIG. 6 depicts an example format for race logic data that could be passed to the race logic synthesis functions. Each race logic record stores one race logic data, and it consists of a race logic type and a set of object specification. The race logic type is represented by a keyword as depicted in Table 3.

TABLE 3

Race Logic Type Keywords for a Race Logic Data Record

| Race logic type keyword | Race logic Represented |
| --- | --- |
| CS | Concurrent assignment race logic |
| CSR | Concurrent assignment and reference race logic |
| CI | Concurrent invocation race logic |

In addition to the race logic type keyword, a race logic data record also contains object specification information. Table 4 depicts an example format of race logic object specification.

TABLE 4

Example Format of Race Logic Object specification

| Race logic object specification | Data specified |
| --- | --- |
| S = <signal name> | S = specifies a signal/register name in an IC design |
| F = [<source_file>,]<function name> | F = specifies a function name and an optional source file name |
| P = <source file>, <line Number>[,<function name>] | P = specifies a source file name and start line number or an event block, optionally specifies a function name |

For the race logic depicted in FIG. 2, the race logic data record for the signal x will be:

CS S=test.x P=/project/IC/a.v,2 P=/project/IC/a.v,3

Where "CS" indicates the data record is for concurrent assignment race logic. The S=test.x specifies the concurrent assignment race occurs on the register test.x. Finally, the P=a.v,2 and P=a.v,3 represent the event blocks in the source file /project/IC/a. v, at line 2 and line 3 respectively, are the concurrent driving blocks for test.x. Note an event block may be an "always" block in Verilog and SystemVerilog, or a "process" block in VHDL. If an IC design has only one source file, then user may skip the file name specification for the P=field (e.g., P=2 P=3).

For the race logic depicted in FIG. 3, the race logic data record for signal x will be:

CSR S=test.x P=/project/IC/a.v,2 P=/project/IC/a.v,3

Where "CSR" indicates the data record is for concurrent assignment and reference race logic. The S=test.x specifies the concurrent assignment and reference race occurs on the signal test.x. Finally, the P=a.v,2 and P=a.v,3 represent the event blocks in the source file /project/IC/a.v, at line 2 and line 3 respectively, that are involved in the concurrent assignment and reference race logic. The race logic synthesis functions can determine which event block is driving test.x, and which event block is driven by test.x, via the design database.

For the race logic depicted in FIG. 4. the race logic data record for the file descriptor fd will be:

CI S=test.fd P=a.v,2,$write P=a.v,3,$read

Where "CI" indicates the data record is for concurrent invocation race logic. The S=test.fd specifies the concurrent invocation race occurs on test.fd. and the P=a.v,2,$write and P=a.v,3,$read represent the race occurs via the $read and $write functions, that are invoked by the event blocks in the source file a. v, at line 2 and line 3, respectively. From the design database, the race logic synthesis functions can determine that the $write function writes data to the IO stream as referenced by test.fd, and the $read function reads data from the IO stream as referenced by test.fd.

For the race logic depicted in FIG. 5, the race logic data record is:

CI F=$random, P=a.v,2, P=a.v,3

Where "CI" indicates the data record is for concurrent invocation race logic. The F=$random specifies the concurrent invocation race occurs for the system function $random, and the event blocks responsible for the concurrent invocation race are in the source file a. v, at line 2 and line 3, respectively. Note that if a function (task) is user-defined, then user may specify the source file name of the function (task) in the F=field:

F=/project/IC/my_random.v,$my_random

Besides the aforementioned race logic data records that are being passed to the race logic synthesis functions, user may also specify whether event blocks are executed in the same or reverse order as they are specified in the HDL/ESL source files, as per the target EDA tool. By default, the execution order of event blocks is pre-determined based on the host EDA tool's behavior as executed on a 1-CPU computer. But user may override that to be the behavior of a third-party target EDA tool instead, so that the re-synthesized design database will render the host EDA tool to behave like the target EDA tool.

The following sections will depict the detailed race logic synthesis technologies for the race logic commonly found in large-scale IC designs.

5.1 Race Logic Synthesis for Concurrent Assignment Race

For a register that has been identified as being driven concurrently by two or more event blocks or concurrent assignment statements, merge those blocks/assignment statements into one event block, so as to impose a deterministic driving order for the register. The event blocks and/or assignment statements may be located in the same design module, or they could be located in different design modules that are placed in the same or different source files. Note that if two event blocks drive a same register concurrently with a blocking and a non-blocking assignment, then there is no concurrent assignment race issue, as the non-blocking assignment is always executed after the blocking assignment. However, if the register is driven by all blocking or all non-blocking assignment statements in two or more event blocks or concurrent assignment statements, then there is a concurrent assignment race issue for the register with respect to those event blocks/concurrent assignment statements.

Refer to FIG. 2, the register x is driven by the event blocks at line 2 and line 3 respectively. The two event blocks are triggered by the positive-edge (posedge) of clk and any edge (anyedge) of clk, respectively. Thus, when clk changes state from '0' to '1' (a posedge event), both the event blocks at line 2 and line 3 will be executed concurrently, and they will assign register x the value of '1' or '0', respectively. The actual value assigned to x will be determined by which event block is executed last in the IC circuit, or the order of execution of event blocks by the target EDA tool. The target EDA tool by default is the host EDA tool that has incorporated the race logic synthesis functions. But user may specify a different target tool as a reference for the race logic synthesis functions, so that the re-synthesized logic will render the host EDA tool to yield analysis results that are the same as that by the target EDA tool.

If there are only two event blocks that could concurrently driving the same register, and both of them use blocking (or non-blocking) assignments to drive the register (as shown in FIG. 2, where both event blocks use blocking assignments to drive register x), then if one of those event blocks does not reference the register's value, the driving statement for the register in that event block can be changed to non-blocking (or blocking) assignment, this will eliminate the concurrent assignment race logic, as the two event blocks will now drive the register in deterministic order. FIG. 7 depicts a resolution to the concurrent assignment race logic for FIG. 2, where the assignment to register x in the event block at line 3 is changed to a non-blocking assignment. Thus, when signal clk changes states from '1' (or 'X') to '0' (a negedge event), the register x will be assigned with signal d value first, then it is assigned the value '0' afterward. This method will not work if there are more than two concurrent driving event blocks/statements to a register, or the logic is coded in a design language that does not support non-blocking assignment (e.g., VHDL, SystemC).

As another method to resolve concurrent assignment race logic, if the target EDA tool always executes event blocks in the same order as they are specified in the HDL/ESL source files, then the race logic in FIG. 2 can be re-synthesized to the logic as shown in FIG. 8, where the register x is assigned a value of '0' whenever the signal clk changes state. This is because when the target EDA tool is running on a 1-CPU/core computer, when clk changes state from '0' to '1', the event block at line 2 is executed first, which assigns a value of '1' to x, then the event block at line 3 is executed next, and it assigns a value of '0' to x. The net effect is register x is set to '0'. On the other hand, when clk changes state from any other logic value (e.g., from '1' to '0'), only the event block at line 3 will be triggered, and it assigns the value '0' to x. Hence the overall effect is x is assigned a value of '0' whenever clk changes states.

However, if the target EDA tool always executes event blocks in the reverse order as they are specified in the HDL/ESL source files, then the race logic in FIG. 2 can be re-synthesized to the logic as shown in FIG. 9. Specifically, when the target EDA tool is running on 1-CPU/core computer, when clk changes state from '0' to '1', the execution of the event block at line 2 will override that of event block at line 3. But if clk changes state to any other value (e.g., from '1' to '0'), then only the event block at line 3 is triggered. Hence the logic in FIG. 9 captures the overall logic of the two event blocks in FIG. 2, according to the positive-edge and non-positive edge event of clk, respectively.

The general race synthesis methods for concurrent assignment race are:

(a) If there are only two event blocks driving a register or signal, and they both use blocking (or non-blocking) assignment statements to drive the register/signal, and one of them only drives the register/signal only, then change the assignment statements in that event block for the register/signal to be non-blocking (or blocking) assignments. This will impose a deterministic order for the assignments to the register or signal, and the concurrent assignment race logic is resolved. This method is applicable only if the event blocks are coded in a design language that supports blocking and non-blocking assignments (e.g., Verilog, SystemVerilog), and there are only two driving event blocks for the register/signal.

(b) For two or more event blocks that are identified to be involved in concurrent assignment race for a register or signal, collect the trigger signals for each of these event blocks. Merge these trigger signals to form a new triggering signal list for a new event block. If a signal is the trigger signal for two or more event blocks, merge them into a single event block according to its triggering edge for each event block as shown in Table 5.

TABLE 5

| Merge triggering signals for the new event blocks | | | |
|---|---|---|---|
| Trigger edge for | Trigger edge for event block 2 | | |
| event Block 1 | Posedge x | Negedge x | Anyedge x |
| Posedge x | Posedge x | Anyedge x | Anyedge x |
| Negedge x | Anyege x | Negedge x | Anyedge x |
| Anyedge x | Anyedge x | Anyedge x | Anyedge x |

For example, if two event blocks are triggered by the posedge (or negedge) of a signal x, then the merged event block will be triggered by the posedge (or negedge) of signal x. On the other hand, if the two event blocks are triggered by posedge (or negedge) and anyedge of signal x, respectively, then the new merged event block will be triggered by anyedge of signal x. Finally, if two event blocks are triggered by the posedge and negedge of a signal x, respectively, then there is no race logic render by these two event blocks (as they will be executed at opposite edges of signal x), unless the two event blocks are also triggered by one or more other signals at compatible active edges (e.g., the two event blocks are also triggered by the same posedge or negedge of signal y, or the event blocks are triggered by the posedge and anyedge of signal y, respectively).

(c) If two event blocks are triggered by the same signal with the same trigger edge, copy the logic from the two event blocks to the merged event block, in the same order as the target EDA tool executes event blocks. For example, if event block x is specified before event y an IC's design source files, and the target EDA tool executes event blocks in the same order as they are specified in design source files, then the new merged event block will contain the logic for event block x first, then the logic for event block y. However, if the target EDA tool executes event blocks in the reverse order as they are specified in design source files, then the merged event block will contain the logic for event blocky first, then followed by the logic for event block x.

(d) If two event blocks x and y are triggered by the posedge (or negedge) and the anyedge of a signal z, respectively, then the merged event block will be triggered by the anyedge of z. Furthermore, if x is specified before y in the design source files, and the target EDA tool executes event blocks in the same order as specified in design source files, then the merged event block will contain the logic of x, where the logic is executed when z is '1' (or '0') only, then the merged event block contains the logic of y, that is unconditionally executed whenever z is active (i.e., changes state). For example, refer to FIG. 2 where x and y are the event blocks at line 2 and line 3, respectively. Then depending on the target EDA tool executes event blocks in the same or reverse order as they are specified in design source files, the merged event block is shown in FIG. 8 and FIG. 9, respectively.

(e) If two event blocks x and y are triggered by the posedge (or negedge) and the negedge (or posedge) of a signal z, respectively, then there is no race issue, as the logic of x and y are executed at different active edge of signal z. However, if the event blocks are also triggered by a common signal p that may render concurrent assignment race (see FIG. 10) for a register driven by both event blocks, then the event blocks may be merged into one event block as shown in FIG. 11. Note the merged event block is triggered by the anyedge of z and the trigger edge of p. Furthermore, if x is specified before y in design source files, and the target EDA tool executes event blocks in the same order as they are specified in design source files, then the merged event block will contain the logic of y that is executed when p is active, then it contains the logic of x, where the logic is executed when z is '1' (or '0') only; and finally the merged event block will contain the logic of y, that is executed when z is '0' (or '1'). However, if the target EDA tool executes event blocks in the reverse order as they are specified in design source files, then the logic in FIG. 10 may be re-synthesized to the event block as shown in FIG. 12, where the merged event block contains the logic in event block of x that is executed when p is active, then it is followed by the logic in event block x and y that are executed when z is '1' (or '0') and '0' (or '1'), respectively.

(f) Refer to FIG. 13, if two event blocks x and y are triggered by the same clock signal (posedge or negedge) and they both assign to and then read from the same register concurrently. If that register (e.g., ack in FIG. 13) is not being referenced or assigned to in other part of the design, then it can be duplicated in each of its driving event blocks, as shown in FIG. 14, to eliminate the concurrent assignment race logic.

(g) If a signal is concurrently driven by multiple concurrent assignment statements, as shown in FIG. 15, and those drivers drive non-overlapping bits of the signal, then those concurrent assignment statements can be converted to a single concurrent assignment statement, as shown in FIG. 16, where the logic is free of concurrent assignment race issue.

5.2 Race Logic Synthesis for Concurrent Assignment and Reference Race

When two or more event blocks in an IC circuit may concurrently assign value(s) and reference a signal or register, those event blocks are involved in concurrent assignment and reference race with respect to the signal or register. Note if an event block drives register/signal via a non-blocking assignment, and another event block reference the same register/signal at the same time, there is no concurrent assignment and reference race, as the assignment is always executed after the reference of the register's/signal's value. However, if the assignment is a blocking assignment, then there is a concurrent reference and assignment race issue for the register/signal with respect to the two aforementioned event blocks.

Refer to FIG. 3, the signal x is driven and referenced by the event blocks at line 2 and line 3, respectively. The two event blocks are triggered by the positive-edge of clk and any edge of clk, respectively. Thus, when clk changes state from '0' to '1' (a positive edge event), both the event blocks at line 2 and line 3 in FIG. 3 will be executed concurrently. The event block at line 2 will assign the current value of signal d to x, while the event block at line 3 will reference x's value at the same time. In the IC circuit, the actual x's value read by event block at line 3 will be determined by whether it is executed before the execution of the event block at line 2 (it reads the current value of x), or after (it reads the new value of x). For the target EDA tool, the actual x's value read by the event block at line 3 will be determined by the order of evaluation of event blocks by the target EDA tool. If the target EDA tool always executes event blocks in the same order as they are specified in design source files, then event block at line 3 will reference the new value of x. However, if the target EDA tool always executes event blocks in the reverse order as they are specified in design source files, then the event block at line 3 will always reference the current value of x.

The general race logic synthesis methods for concurrent assignment and reference race are:

(h) If two or more event blocks are identified to be involved in concurrent assignment and reference race for a signal or register, if the process blocks that drive the signal or register do not reference the signal or register values also, and they are coded in HDL language(s) that supported non-blocking assignments (e.g., Verilog and SystemVerilog), then change the assignment type for the signal or register in all those driver blocks to be non-blocking, so that the assignments to the signal or registers are always performed after the signal or register is being referenced in the other process blocks. For example, FIG. 17 depicts the re-synthesized logic for FIG. 3, where the assignment to signal x in the process block at line 2 has been changed to non-blocking assignment, hence this resolves the concurrent assignment and reference race issue for signal x.

(i) If two or more event blocks are identified to be involved in concurrent assignment and reference race for a signal or register, and the process blocks that drive the signal or register may also reference the signal or register values, or they are coded in design languages that do not support non-blocking assignments (e.g., VHDL or SystemC), then collect the trigger signals for each of these event blocks. Merge these trigger signals to form a new trigger signal list for a new event block. If a signal is the trigger signal for two or more event blocks, merge them according to the signal's triggering edge for each event block as shown in Table 5. For example, if two event blocks are triggered by the posedge (or negedge) of signal x, then the merged event block will be triggered by the posedge (or negedge) of signal x. On the other hand, if the two event blocks are triggered by posedge (or negedge) and anyedge of signal x, respectively, then the new merged event block will be triggered by anyedge of signal x.

(j) If two event blocks that are involved in concurrent assignment and reference race are triggered by the same signal with the same trigger edge, copy the logic from the two event blocks to the merged event block, in the order as the target EDA tool executes event blocks. For example, if event block x is specified before event y in design source files, and the target EDA tool executes event blocks in the same order as they are specified in design source files, then the new merged event block will contain the logic for event block x first, then the logic for event block y. However, if the target EDA tool executes event blocks in the reverse order as that specified in design source files, then the merged event block will contain the logic for event block y first, then the logic for event block x.

(k) If two event blocks x and y are triggered by the posedge (or negedge) and the anyedge of a signal z, respectively, then the merged event block will be triggered by the anyedge of z. Furthermore, if x is specified before y in design source files, and the target EDA tool executes event blocks in the same order as they are specified in design source files, then the merged event block will contain the logic of x, where the logic is executed when z is '1' (or '0') only, then the merged event block contains the logic of y, that is unconditionally executed whenever z is active (i.e., changes state). For example, refer to FIG. 3 where x and y are the event blocks at line 2 and line 3, respectively. Then depending on the target EDA tool executes event blocks in the same or reverse order as they are specified in design source files, the merged event block is as shown in FIG. 18 and FIG. 19, respectively.

(l) If two event blocks x and y are triggered by the posedge (or negedge) and the negedge (posedge) of a signal z, respectively, then there is no race issue, as the logic of x and y are executed at different active edges of signal z. However, if the event blocks are also triggered by a common signal p that may render concurrent assignment and reference race (see FIG. 20), then the event blocks may be merged into a single event block as shown in FIG. 21. Note the merged event block is triggered by the anyedge of z and the trigger edge of p. Furthermore, if x is specified before y in design source files, and the target EDA tool executes event blocks in the same order as they are specified in design source files, then the merged event block will contain the logic of x and y, in the same order as they are specified in design source file, that is executed when p is active; then the merged event block contains the logic of x, where the logic is executed when z is '1' (or '0') only, and then it is followed by the logic of y, that is executed when z is '0' (or '1'). However, if the target EDA tool executes event blocks in the reverse order as they are specified in design source files, then the logic in FIG. 20 may be re-synthesized to the event block as shown in FIG. 22, where the merged event block contains the logic in event block of y and x, in the reverse order as specified in design source file, that is executed when p is active, then it is followed by the logic in event block x and y that are executed when z is '1' (or '0') and '0' (or '1'), respectively.

5.3 Race Logic Synthesis for Concurent Ivocation Race of User-Defined Functions/Tasks When two or more user-defined functions/tasks that are invoked in different event blocks in an IC design may concurrently assign value(s) to and/or reference a same signal, register or IO stream, those functions/tasks are involved in concurrent invocation race with respect to the signal, register or IO stream. Whereas it is safe (no race logic) when two or more event blocks concurrently referencing the same signal or register, it is a race condition if two or more event blocks concurrently reading data from the same IO stream via the same stream designator, as each IO stream read will get data from a different location from the stream. Furthermore, any concurrent write/write or read/write of the same IO stream via the same or different stream designators by different event blocks may also render race logic as the exact IO stream locations where the write/write or read/write accessing is in-determinant.

Refer to FIG. 4, when the signal clk changes state from '0' to '1', both event blocks at line 2 and line 3 are active at the same time, and data may be read from and written to the 10 stream as referenced by fd, via the $read function and the $write task, respectively. This renders concurrent assignment and reference race logic with respect to the IO stream. Specifically, if the target EDA tool executes event blocks in the same order as they are specified in design source files, data will be read from the IO stream first, then new data are written to the IO stream. However, if the target EDA tool executes event blocks in the reverse order as they are specified in design source files, new data will be written to the IO stream first, and then data are read from the IO stream. In physical chips, both event blocks in FIG. 4 will be executed concurrently, and the actual data read from the IO stream is in-determinant.

The general race synthesis methods for concurrent invocation race are:

(m) For two or more event blocks that are identified to be involved in concurrent invocation race via two or more user-defined functions/tasks, that may render concurrent assignment race and/or concurrent assignment/reference race logic for one or more user-defined signals, registers, and/or IO streams, collect the trigger signals for each of these event blocks. Merge these trigger signals to form a new trigger signal list for a new event block. If a signal is the trigger signal for two or more of the event blocks, merge them according to its trigger edge for each event block as shown in Table 5. For example, if two event blocks are triggered by the posedge (or negedge) of signal x, then the merged event block will be triggered by the posedge (or negedge) of signal x. On the other hand, if the two event blocks are triggered by posedge (or negedge) and anyedge of signal x, respectively, then the new merged event block will be triggered by anyedge of signal x.

(n) If two event blocks are triggered by the same signal with the same trigger edge, copy the logic from the two event blocks to the merged event block, in the order as the target EDA tool executes event blocks. For example, if event block x is specified before event y in a list of HDL/ESL source files being compiled for an IC design, and the target EDA tool executes event blocks in the same order as they are specified in design source files, then the new merged event block will contain the logic for event block x first, then followed by the logic for event blocky. However, if the target EDA tool executes event blocks in the reverse order as that specified in design source files, then the merged event block will contain the logic for event block y first, then followed by the logic for event block x.

(o) If two event blocks x and y are triggered by the posedge (or negedge) and the anyedge of a signal z, respectively, then the merged event block will be triggered by the anyedge of z. Furthermore, if x is specified before y in design source files, and the target EDA tool executes event blocks in the same order as they are specified in design source files, then the merged event block will contain the logic of x, where the logic is executed when z is '1' (or '0') only, then the merged event block contains the logic of y, that is unconditionally executed whenever z is active (i.e., changes state). For example, refer to FIG. 4 where x and y are the event blocks at line 2 and line 3, respectively. Then depending on the target EDA tool executes event blocks in the same or reverse order as they are specified in design source files, the merged event block is as shown in FIG. 23 and FIG. 24, respectively.

(p) If two event blocks x and y are triggered by the posedge (or negedge) and the negedge (or posedge) of a signal z, respectively, then there is no race issue, as the logic of x and y is executed at different active edge of signal z. However, if the event blocks are also triggered by a common signal p that may render concurrent invocation race (see FIG. 25), then the event blocks may be merged into one event block as shown in FIG. 26. Note the merged event block is triggered by the anyedge of z and the trigger edge of p. Furthermore, if x is specified before y in design source files, and the target EDA tool executes event blocks in the same order as they are specified in design source files, then the merged event block will contain the logic of x and y, in the same order as specified in the source file, that is executed when p is active, then the merged event block contains the logic of x, where the logic is executed when z is '1' (or '0') only, and that is followed by the logic of y, that is executed when z is '0' (or '1'). However, if the target EDA tool executes event blocks in the reverse order as they are specified in design source files, then the logic in FIG. 25 may be re-synthesized to the event block as shown in FIG. 27 where the merged event block contains the logic in event block of y and x, in the reverse order as specified in design source file, that is executed when p is active, then it is followed by the logic in event block x and y that are executed when z is '1' (or '0') and '0' (or '1'), respectively.

5.4 Race Logic Synthesis for Concurrent Invocation Race of System-Defined Functions/Tasks When two or more event blocks in an IC design concurrently invoke system-defined functions/tasks, it may render concurrent assignment and/or concurrent assignment/reference race for one or more system signals or registers. Whereas it is safe (no race logic) when two or more event blocks concurrently reference the state of the same signal or register, it is a race condition if those event blocks concurrently invoke the same system function, like the Verilog $random, and the values returned by the system function/task to those event blocks are in-determinant, as will be explained below.

Refer to FIG. 5, when the signal clk changes state from '0' to '1', both event blocks at line 2 and line 3 are active at the same time, and the two event blocks will concurrently call the Verilog $random system function. Note that the $random uses the system variable seed to generate a pseudo-random number to be returned to the caller, and then the $random function will update the seed value for the next call. Thus, when the Verilog $random function is concurrently invoked by two or more event blocks, the random values as returned to those event blocks are in-determinant.

The general race synthesis methods for concurrent invocation race are:

(q) For two or more event blocks that are identified to be involved in concurrent invocation race of two or more system-defined functions/tasks, that may render concurrent assignment race and/or concurrent assignment/reference race logic for one or more system-defined signals, registers, and/or IO streams, collect the trigger signals for each of these event blocks. Merge these trigger signals to form a new trigger signal list for a new event block. If a signal is the trigger signal for two or more event blocks, merge them according to its triggering edge for each event block as shown in Table 5. For example, if two event blocks are triggered by the posedge (or negedge) of signal x, then the merged event block will be triggered by the posedge (or negedge) of signal x. On the other hand, if the two event blocks are triggered by posedge (or negedge) and anyedge of signal x, respectively, then the new merged event block will be triggered by anyedge of signal x.

(r) If two event blocks are triggered by the same signal with the same trigger edge, copy the logic from the two event blocks to the merged event block, in the order as the target EDA tool executes event blocks in design source files. For example, if event block x is specified before event y in design source files, and the target EDA tool executes event blocks in the same order as they are specified in design source files, then the new merged event block will contain the logic for event block x first, then followed by the logic for event block y. However, if the target EDA tool executes event blocks in the reverse order as they are specified in design source files, then the merged event block will contain the logic for event blocky first, then followed by the logic for event block x.

(s) If two event blocks x and y are triggered by the posedge (or negedge) and the anyedge of a signal z, respectively, then the merged event block will be triggered by the anyedge of z. Furthermore, if x is specified before y in design source files, and the target EDA tool executes event blocks in the same order as they are specified in design source files, then the merged event block will contain the logic of x, where the logic is executed when z is '1' (or '0') only, then the merged event block contains the logic of y, that is unconditionally executed whenever z is active (i.e., changes state). For example, refer to FIG. 5 where x and y are the event blocks at line 2 and line 3. Then depending on the target EDA tool executes event block in the same or reverse order as they are specified in design source files, the merged event block is as shown in FIG. 28 and FIG. 29, respectively.

(t) If two event blocks x and y are triggered by the posedge (or negedge) and the negedge (or posedge) of a signal z, respectively, then there is no race issue, as the logic of x and y are executed at different active edge of signal z. However, if the event blocks are also triggered by a common signal p that may render concurrent invocation race (see FIG. 30), then the event blocks may be merged into one event block as shown in FIG. 31. Note the merged event block is triggered by the anyedge of z and the trigger edge of p. Furthermore, if x is specified before y in design source files, and the target EDA tool executes event blocks in the same order as they are specified in design source files, then the merged event block will contain the logic of x and y, in the same order as they are specified in the source files, that is executed when p is active, then the merged event block contains the logic of x, where the logic is executed when z is '1' (or '0') only, and that is followed by the logic of y, that is executed when z is '0' (or '1'). However, if the target EDA tool executes event blocks in the reverse order as they are specified in design source files, then the logic in FIG. 30 may be re-synthesized to the event block as shown in FIG. 32 where the merged event block contains the logic in event block of y and x, in the reverse order as specified in design source files, that is executed when p is active, then it is followed by the logic in event block x and y that are executed when z is '1' (or '0') and '0' (or '1'), respectively.

5.5 Output of Re-Synthesized Logic to HDL/ESL Files

Another aspect of the invention is the capability to output revised HDL/ESL source files of an IC design that has been re-synthesized by the aforementioned race logic synthesis functions to get rid of race logic. User may provide the revised HDL/ESL sources to third party's logic synthesis and verification tools for further verification of their IC designs.

In order to be able to output revised HDL/ESL source files for an IC design, the host EDA tool must record the following information for each event block found in an IC design source file:
1. Source file path name
2. Design module name (or VHDL Entity/Architecture names)
3. The event block start line number
4. The event block end line number When two or more event blocks in an IC design that render race logic are merged into a single event block, the HDL/ESL source file(s) that contain those event blocks are modified as explained below. Note that the event blocks may be in the same or different design modules (or VHDL architectures). Furthermore, if event blocks are in different modules, those modules may reside in the same or different source files.

When two or more event blocks are merged into one event block, pick the event block that has the most driving input signals/registers and output signals as the target event block to contain the merged event logic, the other event blocks that are being re-synthesized will be replaced or discarded.

Let:
$I_x$ and $O_x$ be the set of input and output signals of an event block x
$I_y$ and $O_y$ be the set of input and output signals of an event block y
$R_d$ be the set of output signals in $O_x$ and $O_y$ that have concurrent assignment race
$R_j$ be the set of output signals in $O_x$ and input signals in $I_y$ that are involved in concurrent assignment and reference race logic The logic in event block x and event block y can be re-synthesized to get rid of the race logic, based on the content of $I_x$ versus $I_y$ and $O_x$ versus $O_y$:

5.5.1: Both Event Blocks are Involved in Concurrent Assignment Race: $O_x$ and $O_y$ Contain $R_d$ In this case, all logic in event x that drives the output signals in $R_d$ can be merged into event block y, whereas logic in the two event blocks that drives the output signals in $O_x$ and $O_y$ respectively, that are not in $R_d$ must be retained in the two event blocks.

For example, refer to FIG. 33, $R_d$ consists of the signal x, module a and module b also have output signal y and z, respectively, hence the logic in the event block module b that drives signal x can be re-synthesized into the event block in module a, but the logic that drives signal y and z in the two event blocks is unchanged. FIG. 34 shows the re-synthesized logic of module a and module b. These modules can be written out to HDL/ESL source file(s).

Note that in FIG. 33, the event block in module a is chosen as the target to be modified because $I_x$ (which consists of clk and d) contains more triggering signals for the output signal x than that of $I_y$ (which consists of clk).

5.5.2: Both Event Blocks are Involved in Concurrent Assignment and Reference Race Logic: $O_x$ and $I_y$ Contain $R_j$ In this case, all logic in event block x that drives the output signals in $R_j$ should be merged into event blocky, whereas logic in the two event blocks that drives the output signals in $O_x$ and $O_y$ respectively, that are not in $R_j$ must be retained in the two event blocks.

For example, refer to FIG. 35, $R_j$ consists of the signal x, module a and module b also have output signal y and z, respectively. Hence the logic in the event block in module a that drives signal x will be re-synthesized into the event block in module b, but the logic that drives signal y and z in the two event blocks is unchanged. Note that in the event block in module a, x is driven by ~d, but d is not an input signal to module b, hence we need to use the actual signal (top.i1.data) that is driving the signal d in an instance of module a and use that instead of signal d in the re-synthesized event block in module b.

FIG. 36 shows the re-synthesized logic of module a and module b of FIG. 35. These modules can be written out to HDL/ESL source file(s).

5.5.3: Both Event Blocks x and y are Involved in Concurrent Invocation Race of the $random System Function In this case, if Ox>Oy then merge the logic that invokes $random in module b to module a, or vice versa. If the target module does not contain the signals in the other module that are driven by the $random function, then use the full path names of the actual signals that are used in an instance of the other module.

For example, refer to FIG. 37, both signal x and z are driven by the $random function. Module a is chosen to be the target module for resolving the concurrent invocation race of the $random function, but module a does not have the signal z, thus if the signal z in an instance of module b is actually connected to the signal top.i1.zdata, then that signal name will be used (instead of z) in that re-synthesized module a.

FIG. 38 shows the re-synthesized logic of module a and module b of FIG. 37, that has no concurrent invocation race logic for the $random function. These modules can be written out to HDL/ESL source file(s).

5.5.4: Both Event Blocks x and y are Involved in Concurrent Invocation Race for an IO Stream In this case, if Ox>Oy then merge the logic that is involved in concurrent race of an IO stream in module b to module a, or vice versa. If the target module does not contain the signals in the other module that are referenced in the concurrent invocation race, then use full path names of the actual signals that are used in an instance of the other module.

For example, refer to FIG. 39, both signal x and d are involved in a concurrent invocation race of an IO stream as referenced by a stream designator fd. Module a is chosen to be the target module for resolving the concurrent invocation race for the IO stream, but module a does not have the signal d, thus if the signal d in an instance of module b that is actually connected to the signal top.i1.data, then that signal name will be used (instead of d) in that re-synthesized module a.

FIG. 40 shows the re-synthesized logic of module a and module b of FIG. 39, that has no concurrent invocation race logic for the IO stream designated by fd. These modules can be written out to HDL/ESL source file(s).

5.6 Race Logic Synthesis for IPC Concurrent Assignment Race

For an IPC (inter-process communication) object, which include but not limited to a FIFO (first-in-first-out) buffer, a mailbox and a dynamic queue, that has been identified as being written to a same location concurrently by two or more event blocks, merge those event blocks into one new event block, so as to impose a deterministic writing order for the IPC object. The process blocks may be located in the same design module, or they could be located in different design modules that are placed in the same or different source files.

The general race synthesis methods for IPC concurrent assignment race are:

(u) For two or more event blocks that are identified to be involved in concurrent assignment race for an IPC object, collect the trigger signals for each of these event blocks. Merge these trigger signals to form a new triggering signal list for a new event block. If a signal is the trigger signal for two or more event blocks, merge them into a single event block according to its triggering edge for each event block as shown in Table 5. For example, if two event blocks are triggered by the posedge (or negedge) of a signal x, then the merged event block will be triggered by the posedge (or negedge) of signal x. On the other hand, if the two event blocks are triggered by posedge (or negedge) and anyedge of signal x, respectively, then the new merged event block will be triggered by anyedge of signal x. Finally, if two event blocks are triggered by the posedge and negedge of a signal x, respectively, then there is no race logic render by these two event blocks (as they will be executed at opposite edges of signal x), unless the two event blocks are also triggered by one or more other signals at compatible active edges (e.g., the two event blocks are also triggered by the same posedge or negedge of signal y, or the event blocks are triggered by the posedge and anyedge of signal y, respectively).

(v) If two event blocks are triggered by the same signal with the same trigger edge, copy the logic from the two event blocks to the merged event block, in the same order as the target EDA tool executes event blocks. For example, if event block x is specified before event y an IC's design source files, and the target EDA tool executes event blocks in the same order as they are specified in design source files, then the new merged event block will contain the logic for event block x first, then the logic for event block y. However, if the target EDA tool executes event blocks in the reverse order as they are specified in design source files, then the merged event block will contain the logic for event blocky first, then followed by the logic for event block x.

(w) If two event blocks x and y are triggered by the posedge (or negedge) and the anyedge of a signal z, respectively, then the merged event block will be triggered by the anyedge of z. Furthermore, if x is specified before y in the design source files, and the target EDA tool executes event blocks in the same order as specified in design source files, then the merged event block will contain the logic of x, where the logic is executed when z is '1' (or '0') only, then the merged event block contains the logic of y, that is unconditionally executed whenever z is active (i.e., changes state).

(x) If two event blocks x and y are triggered by the posedge (or negedge) and the negedge (or posedge) of a signal z, respectively, then there is no race issue, as the logic of x and y are executed at different active edge of signal z. However, if the event blocks are also triggered by a common signal p that may render concurrent assignment race for an IPC object by the event blocks, then the event blocks may be merged into one event block. Note the merged event block is triggered by the anyedge of z and the trigger edge of p. Furthermore, if x is specified before y in design source files, and the target EDA tool executes event blocks in the same order as they are specified in design source files, then the merged event block will contain the logic of x, where the logic is executed when z is '1' (or '0') only, and the merged event block will contain the logic of y, that is executed when z is '0' (or '1').

(y) If two event blocks x and y are triggered by the same clock signal (posedge or negedge) and they both assign to and then read from the same IPC object concurrently. If that IPC object is not being referenced or assigned to in any other part of the IC design, then it can be duplicated in each of its driving event blocks to eliminate the concurrent assignment race logic.

5.7 Race Logic Synthesis for IPC Concurrent Assignment and Reference Race

When two or more event blocks in an IC circuit may concurrently assign value(s) and reference an IPC (inter-process communication) object, which include bit not limited to a dynamic queue, those event blocks are involved in concurrent assignment and reference race with respect to the IPC object.

The general race logic synthesis methods for IPC concurrent assignment and reference race are:

(z) If two or more event blocks are identified to be involved in concurrent assignment and reference race for an IPC object, collect the trigger signals for each of these event blocks. Merge these trigger signals to form a new trigger signal list for a new event block. If a signal is the trigger signal for two or more event blocks, merge them according to the signal's triggering edge for each event block as shown in Table 5. For example, if two event blocks are triggered by the posedge (or negedge) of signal x, then the merged event block will be triggered by the posedge (or negedge) of signal x. On the other hand, if the two event blocks are triggered by posedge (or negedge) and anyedge of signal x, respectively, then the new merged event block will be triggered by anyedge of signal x.

(aa) If two event blocks that are involved in concurrent assignment and reference race are triggered by the same signal with the same trigger edge, copy the logic from the two event blocks to the merged event block, in the order as the target EDA tool executes event blocks. For example, if event block x is specified before event y in design source files, and the target EDA tool executes event blocks in the same order as they are specified in design source files, then the new merged event block will contain the logic for event block x first, then the logic for event block y. However, if the target EDA tool executes event blocks in the reverse order as that specified in design source files, then the merged event block will contain the logic for event block y first, then the logic for event block x.

(bb) If two event blocks x and y are triggered by the posedge (or negedge) and the anyedge of a signal z, respectively, then the merged event block will be triggered by the anyedge of z. Furthermore, if x is specified before y in design source files, and the target EDA tool executes event blocks in the same order as they are specified in design source files, then the merged event block will contain the logic of x, where the logic is executed when z is '1' (or '0') only, then the merged event block contains the logic of y, that is unconditionally executed whenever z is active (i.e., changes state).

(cc) If two event blocks x and y are triggered by the posedge (or negedge) and the negedge (posedge) of a signal z, respectively, then there is no race issue, as the logic of x and y are executed at different active edges of signal z. However, if the event blocks are also triggered by a common signal p that may render concurrent assignment and reference race, then the event blocks may be merged into a single event block. Note the merged event block is triggered by the anyedge of z and the trigger edge of p. Furthermore, if x is specified before y in design source files, and the target EDA tool executes event blocks in the same order as they are specified in design source file, that is executed when p is active; then the merged event block contains the logic of x, where the logic is executed when z is '1' (or '0') only, and then it is followed by the logic of y, that is executed when z is '0' (or '1').

5.8 Race Logic Synthesis for IPC Concurrent Delete Race

For an IPC (inter-process communication) object, which include but not limited to a dynamic queue, that has been identified as involved in concurrent delete race logic where two or more event blocks concurrently try to delete a same location in an IPC object, and it may result in multiple locations in the IPC object being deleted. To eliminate the race logic, merge those event blocks into one new event block, so as to impose a deterministic deletion order for the IPC object. The event blocks may be located in the same design module, or they could be located in different design modules that are placed in the same or different source files.

The general race synthesis methods for IPC concurrent delete race are:

(dd) For two or more event blocks that are identified to be involved in concurrent delete race for an IPC object, collect the trigger signals for each of these event blocks. Merge these trigger signals to form a new triggering signal list for a new event block. If a signal is the trigger signal for two or more event blocks, merge them into a single event block according to its triggering edge for each event block as shown in Table 5. For example, if two event blocks are triggered by the posedge (or negedge) of a signal x, then the merged event block will be triggered by the posedge (or negedge) of signal x. On the other hand, if the two event blocks are triggered by posedge (or negedge) and anyedge of signal x, respectively, then the new merged event block will be triggered by anyedge of signal x. Finally, if two event blocks are triggered by the posedge and negedge of a signal x, respectively, then there is no race logic render by these two event blocks (as they will be executed at opposite edges of signal x), unless the two event blocks are also triggered by one or more other signals at compatible active edges (e.g., the two event blocks are also triggered by the same posedge or negedge of signal y, or the event blocks are triggered by the posedge and anyedge of signal y, respectively).

(ee) If two event blocks are triggered by the same signal with the same trigger edge, copy the logic from the two event blocks to the merged event block, in the same order as the target EDA tool executes event blocks. For example, if event block x is specified before event y an IC's design source files, and the target EDA tool executes event blocks in the same order as they are specified in design source files, then the new merged event block will contain the logic for event block x first, then the logic for event block y. However, if the target EDA tool executes event blocks in the reverse order as they are specified in design source files, then the merged event block will contain the logic for event blocky first, then followed by the logic for event block x.

(ff) If two event blocks x and y are triggered by the posedge (or negedge) and the anyedge of a signal z, respectively, then the merged event block will be triggered by the anyedge of z. Furthermore, if x is specified before y in the design source files, and the target EDA tool executes event blocks in the same order as specified in design source files, then the merged event block will contain the logic of x, where the logic is executed when z is '1' (or '0') only, then the merged event block contains the logic of y, that is unconditionally executed whenever z is active (i.e., changes state).

(gg) If two event blocks x and y are triggered by the posedge (or negedge) and the negedge (or posedge) of a signal z, respectively, then there is no race issue, as the logic of x and y are executed at different active edge of signal z. However, if the event blocks are also triggered by a common signal p that may render concurrent delete race for an IPC object by both event blocks, then the event blocks may be merged into one event block. Note the merged event block is triggered by the anyedge of z and the trigger edge of p. Furthermore, if x is specified before y in design source files, and the target EDA tool executes event blocks in the same order as they are specified in design source files, then the merged event block will contain the logic of x, where the logic is executed when z is '1' (or '0') only; and the merged event block will contain the logic of y, that is executed when z is '0' (or '1').

5.9 Race Logic Synthesis for IPC Concurrent Read Race

For an IPC (inter-process communication) object, which include but not limited to a FIFO (first-in-first-out) buffer and a mailbox, that has been identified as involved in concurrent read race logic where two or more event blocks concurrently try to read data from a same location of an IPC object, and it is indeterminate of what data will be read by those event blocks, since the read operation will also remove the (read) data from the IPC object. To eliminate the race logic, merge those event blocks into one new event block, so as to impose a deterministic reading order for the IPC object. The event blocks may be located in the same design module, or they could be located in different design modules that are placed in the same or different source files.

The general race synthesis methods for IPC concurrent read race are:

(hh) For two or more event blocks that are identified to be involved in concurrent read race for an IPC object, collect the trigger signals for each of these event blocks. Merge these trigger signals to form a new triggering signal list for a new event block. If a signal is the trigger signal for two or more event blocks, merge them into a single event block according to its triggering edge for each event block as shown in Table 5. For example, if two event blocks are triggered by the posedge (or negedge) of a signal x, then the merged event block will be triggered by the posedge (or negedge) of signal x. On the other hand, if the two event blocks are triggered by posedge (or negedge) and anyedge of signal x, respectively, then the new merged event block will be triggered by anyedge of signal x. Finally, if two event blocks are triggered by the posedge and negedge of a signal x, respectively, then there is no race logic render by these two event blocks (as they will be executed at opposite edges of signal x), unless the two event blocks are also triggered by one or more other signals at compatible active edges (e.g., the two event blocks are also triggered by the same posedge or negedge of signal y, or the event blocks are triggered by the posedge and anyedge of signal y, respectively).

(ii) If two event blocks are triggered by the same signal with the same trigger edge, copy the logic from the two event blocks to the merged event block, in the same order as the target EDA tool executes event blocks. For example, if event block x is specified before event y an IC's design source files, and the target EDA tool executes event blocks in the same order as they are specified in design source files, then the new merged event block will contain the logic for event block x first, then the logic for event block y. However, if the target EDA tool executes event blocks in the reverse order as they are specified in design source files, then the merged event block will contain the logic for event blocky first, then followed by the logic for event block x.

(jj) If two event blocks x and y are triggered by the posedge (or negedge) and the anyedge of a signal z, respectively, then the merged event block will be triggered by the anyedge of z. Furthermore, if x is specified before y in the design source files, and the target EDA tool executes event blocks in the same order as specified in design source files, then the merged event block will contain the logic of x, where the logic is executed when z is '1' (or '0') only, then the merged event block contains the logic of y, that is unconditionally executed whenever z is active (i.e., changes state).

(kk) If two event blocks x and y are triggered by the posedge (or negedge) and the negedge (or posedge) of a signal z, respectively, then there is no race issue, as the logic of x and y are executed at different active edge of signal z. However, if the event blocks are also triggered by a common signal p that may render concurrent assignment race for a register driven by both event blocks, then the event blocks may be merged into one event block. Note the merged event block is triggered by the anyedge of z and the trigger edge of p. Furthermore, if x is specified before y in design source files, and the target EDA tool executes event blocks in the same order as they are specified in design source files, then the merged event block will contain the logic of x, where the logic is executed when z is '1' (or '0') only; and the merged event block will contain the logic of y, that is executed when z is '0' (or '1').

5.10 Race Logic Synthesis for IPS Concurrent Locking Race

For an IPS (inter-process synchronization) object, which include but not limited to a mutex and a semaphore, that has been identified as involved in concurrent locking race logic where two or more event blocks concurrently try to lock a same IPC object, and it indeterminate of which event block will succeed in locking the IPC object and hence the execution orders of these event blocks are indeterminate. To eliminate the race logic, merge those event blocks into one new event block, so as to impose a deterministic locking order for the IPS object. The event blocks may be located in the same design module, or they could be located in different design modules that are placed in the same or different source files.

The general race synthesis methods for IPS concurrent locking race are:

(ll) For two or more event blocks that are identified to be involved in concurrent locking race for an IPC object, collect the trigger signals for each of these event blocks. Merge these trigger signals to form a new triggering signal list for a new event block. If a signal is the trigger signal for two or more event blocks, merge them into a single event block according to its triggering edge for each event block as shown in Table 5. For example, if two event blocks are triggered by the posedge (or negedge) of a signal x, then the merged event block will be triggered by the posedge (or negedge) of signal x. On the other hand, if the two event blocks are triggered by posedge (or negedge) and anyedge of signal x, respectively, then the new merged event block will be triggered by anyedge of signal x. Finally, if two event blocks are triggered by the posedge and negedge of a signal x, respectively, then there is no race logic render by these two event blocks (as they will be executed at opposite edges of signal x), unless the two event blocks are also triggered by one or more other signals at compatible active edges (e.g., the two event blocks are also triggered by the same posedge or negedge of signal y, or the event blocks are triggered by the posedge and anyedge of signal y, respectively).

(mm) If two event blocks are triggered by the same signal with the same trigger edge, copy the logic from the two event blocks to the merged event block, in the same order as the target EDA tool executes event blocks. For example, if event block x is specified before event y an IC's design source files, and the target EDA tool executes event blocks in the same order as they are specified in design source files, then the new merged event block will contain the logic for event block x first, then the logic for event block y. However, if the target EDA tool executes event blocks in the reverse order as they are specified in design source files, then the merged event block will contain the logic for event blocky first, then followed by the logic for event block x.

(nn) If two event blocks x and y are triggered by the posedge (or negedge) and the anyedge of a signal z, respectively, then the merged event block will be triggered by the anyedge of z. Furthermore, if x is specified before y in the design source files, and the target EDA tool executes event blocks in the same order as specified in design source files, then the merged event block will contain the logic of x, where the logic is executed when z is '1' (or '0') only, then the merged event block contains the logic of y, that is unconditionally executed whenever z is active (i.e., changes state).

(oo) If two event blocks x and y are triggered by the posedge (or negedge) and the negedge (or posedge) of a signal z, respectively, then there is no race issue, as the logic of x and y are executed at different active edge of signal z. However, if the event blocks are also triggered by a common signal p that may render concurrent assignment race for a register driven by both event blocks, then the event blocks may be merged into one event block. Note the merged event block is triggered by the anyedge of z and the trigger edge of p. Furthermore, if x is specified before y in design source files, and the target EDA tool executes event blocks in the same order as they are specified in design source files, then the merged event block will contain the logic of x, where the logic is executed when z is '1' (or '0') only; and the merged event block will contain the logic of y, that is executed when z is '0' (or '1').

What is claimed is:

1. A computer-implemented method for performing race logic synthesis on an ESL (electronic system level)-based IC (integrated circuit) design, comprises using a computer to perform one or more of the following steps:
   (a) Compiling, by computer, an IC design source files, coded in any one or a combination of ESL and any HDL (hardware description language) description languages, into a design database;
   (b) Performing static and/or dynamic race logic analysis of the IC design, either by a host application, or by an external race logic audit tool, or the combination of both;
   (c) Determining the execution order of process blocks of the IC design in the design database, using the default process block execution order by the host application and/or obtaining that order from user;
   (d) Executing the race logic synthesis functions to get rid of all race logic involving ESL IPC (inter-process communication) and IPS (inter-process synchronization) objects, as detected in (b), in the compiled IC design database;
   (e) As a user-specified option or a default action of the host application, generating updated ESL/HDL source files for the IC design, where race logic has been remedied by the race logic synthesis functions in (d);
   wherein step (d) comprises:
   (f) Analyzing all ESL IPC objects, including but not limited to FIFO (first-in-first-out) buffers, mailboxes and dynamic queues, in the IC design that have been determined to be involved in concurrent assignment (write) race logic, and re-synthesizing the driving process blocks of these IPC objects, to eliminate the race logic while retaining the original logic functions of the IC design;
   (g) Analyzing all ESL IPC objects, including but not limited to dynamic queues, in the IC design that have been determined to be involved in concurrent assignment (write) and reference (read) race logic, and re-synthesizing all the driving and driven process blocks of these IPC objects, to eliminate the race logic while retaining the original logic functions of the IC design;
   (h) Analyzing all ESL IPC objects, including but not limited to dynamic queues, in the IC design that have been determined to be involved in concurrent delete race logic, and re-synthesizing all the driving process blocks of these IPC objects, to eliminate the race logic while retaining the original logic functions of the IC design;
   (i) Analyzing all ESL IPC objects, including but not limited to FIFO buffers and mailboxes, in the IC design that have been determined to be involved in concurrent reference (read) race logic, and re-synthesizing the driven process blocks of these IPC objects, to eliminate the race logic while retaining the original logic functions of the IC design;
   (j) Analyzing all ESL IPS objects, including but not limited to semaphores and mutexes (mutually exclusive locks), in the IC design that have been determined to be involved in concurrent locking race logic, and re-synthesizing the driving process blocks of these IPS objects, to eliminate the race logic while retaining the original logic functions of the IC design.

2. A computer-implemented method for performing race logic synthesis on an ESL (electronic system level)-based IC (integrated circuit) design, comprises using a computer to perform one or more of the following steps:
   (a) Compiling, by computer, an IC design source files, coded in any one or a combination of ESL and any HDL (hardware description language) design languages, into a design database;
   (b) Performing static and/or dynamic race logic analysis of the IC design, either by a host application, or by an external race logic audit tool, or the combination of both;
   (c) Determining the execution order of process blocks of the IC design in the design database, using the default process block execution order by the host application and/or obtaining that order from user;
   (d) Executing the race logic synthesis functions to get rid of all race logic, as detected in (b), in the compiled IC design database;
   (e) As a user-specified option or a default action of the host application, generating updated ESL/HDL source files for the IC design, where race logic has been remedied by the race logic synthesis functions in (d);
   wherein step (d) comprises:
   (f) For each IPC object, including but not limited to a FIFO (first-in-first-out) buffer, a mailbox and a dynamic queue, that has been identified as having concurrent assignment (write) race logic issue, as detected in step (b), collecting the driving factors for each driving process block of the IPC object;
   (g) Collecting all driving process blocks of the IPC object that have one or more driving factors that are compatible;
   (h) Replacing all driving process blocks that have compatible driving factors by one single process block to impose a deterministic assignment order to the IPC object in the merged process block;
   (i) As an alternative to (h), if each driving process block of an IPC object always assigns to the object and then reads values from that object, and the IPC object is not being referenced in any other part of the IC design, then the IPC object can be duplicated in each of its driving process block, with no change to the driving process blocks' logic, to eliminate concurrent assignment race logic for the IPC object.

3. The method of claim 2 wherein the operation of (g) further comprises the step of collecting the driving factors for each driving process block of an IPC object, wherein the driving factors comprise: triggering signals to the process block; a trigger event type; possible delays in writing a new value to the IPC; the assignment location of the IPC object; possible enabling conditions which control the assignment event; and an assigned new state value or driving signals and/or registers.

4. The method of claim 2 wherein the operation of (h) further comprises checking if any two sets of driving factors for two driving process blocks of an IPC object are compatible simultaneously, wherein the two sets of driving factors are compatible if they contain one or more the same trigger signals that are triggered by compatible event types, and the IPC object could be assigned with different logic values at the same location of the IPC object, and at the same time when the triggered signals are active.

5. The method of claim 4 wherein the trigger event types of a trigger signal in two sets of driving factors are compatible if they are of the same event type (positive-edge, negative-edge or any-edge), one is positive-edge and the other is any-edge or one is negative-edge and the other is any-edge.

6. The method of claim 2 wherein the operation of (h) further comprises replacing all the driving process blocks that are found to have compatible driving factors by a new driving process block, wherein the new driving process block will contain all the ESL/HDL code of the replaced driving process blocks, and the new driving process block will be triggered by new driving factors.

7. The method of claim 6 further comprising the step of creating new driving factors for the newly created driving process block for an IPC object, wherein the new driving factors will contain the union of all the triggered signals in the driving factors of the replaced process blocks, and if the trigger event types of a trigger signal in the replaced driving factors are the same (e.g., all are positive-edge trigger, all are negative-edge trigger, or all are any-edge trigger), then using the same trigger event type for the trigger signal in the new driving factors, and if the trigger event types of a trigger signal in the replaced driving factors are not the same, then using the any-edge trigger event type for the trigger signal in the new driving factors.

8. The method of claim 7 further comprising the step of merging all ESL/HDL code of the replaced driving process blocks into a new driving process block further comprising determining the order of the replaced driving process blocks that are specified in the ESL/HDL source files, and the orders of process block execution in claim 2 step (c) and if the order of execution of process blocks is the same as they are specified in the ESL/HDL source files, the new driving process block contains the ESL/HDL code of the replaced process blocks, in the same order as they are specified in the ESL/HDL source files, and if the execution of process blocks is in the reverse order as specified in the ESL/HDL source files, then the new driving process block contains the ESL/HDL code of the replaced process blocks, in the reverse order as those process blocks are specified in the ESL/HDL source files.

9. The method of claim 8 further comprising the step of adding a controlling expression for the ESL/HDL code from a replaced process block when the code is copied to the new driving process block when a replaced driving process block is triggered by a positive-edge (or negative-edge) of a trigger signal, wherein the new driving process block is triggered by the any-edge of that trigger signal, wherein the controlling condition consists of the trigger signal's value equals logic '1' (or logic '0') for the copied ESL/HDL code to be executed when the new driving process block is active, and if there are multiple trigger signals in the controlling condition, the trigger signals' asserted states are logically OR'ed together to form a new controlling expression.

10. A computer-implemented method for performing race logic synthesis on an ESL (electronic system level)-based IC (integrated circuit) design, comprises using a computer to perform one or more of the following steps:
  (a) Compiling, by computer, an IC design source files, coded in any one or a combination of ESL and any HDL (hardware description language) design languages, into a design database;
  (b) Performing static and/or dynamic race logic analysis of the IC design, either by a host application, or by an external race logic audit tool, or the combination of both;
  (c) Determining the execution order of process blocks of the IC design in the design database, using the default process block execution order by the host application and/or obtaining that order from user;
  (d) Executing the race logic synthesis functions to get rid of all race logic, as detected in (b), in the compiled IC design database;
  (e) As a user-specified option or a default action of the host application, generating updated ESL/HDL source files for the IC design, where race logic has been remedied by the race logic synthesis functions in (d);
wherein step (d) comprises:
  (f) For each IPC object, including but not limited to a dynamic queue, that is identified as involved in concurrent assignment and reference race logic, according to (b), collecting the driving factors for each driving process block (which performs the assignment operation) and the driving factors of each driven process block (which performs the reference operation) of the IPC object;
  (g) Collecting all driving and driven process blocks of the IPC object that have one or more driving factors that are compatible; and
  (h) Replacing all driving and driven process blocks that have compatible driving factors by a new process block, so as to impose a deterministic assignment and reference order of the IPC object in the new process block.

11. The method of claim 10 wherein the operation of (g) further comprises collecting the driving factors for each driving and driven process block of an IPC object, wherein the driving factors comprise: triggering signals to the process block; a trigger event type; possible delays in performing the write or read operation, the write or read location in the IPC object, possible enabling conditions which control the write or read event.

12. The method of claim 10 wherein the operation of (g) further comprises checking if any two sets of driving factors for two driving and driven process blocks of an IPC object are compatible simultaneously, wherein the two sets of driving factors are compatible if they contain one or more the same trigger signals that are triggered by compatible event types, the same read and write location and at the same time, when the triggered signals are active.

13. The method of claim 12 wherein the trigger event types of a trigger signal in two driving factors are compatible if they are of the same event type (positive-edge, negative-edge or any-edge), one is positive-edge and the other is any-edge or one is negative-edge and the other is any-edge.

14. The method of claim 10 wherein the operation of (h) further comprises replacing all the driving and driven process blocks that are found to have compatible driving factors by a new process block that contains all the ESL/HDL code of the replaced process blocks, and the new process block is triggered by new driving factors.

15. The method of claim 14 further comprising the step of creating new driving factors for the newly created process block for an IPC object that contains all triggered signals in the driving factors of the replaced driving and driven process blocks, and if the trigger event types of a trigger signal in the replaced driving factors are the same, then using the same trigger event type for the trigger signal in the new driving factors, and if the trigger event types of a trigger signal in the replaced driving factors are not the same, then using the any-edge trigger event type for the trigger signal in the new driving factors.

16. The method of claim 15 further comprising the step of merging all ESL/HDL code of the replaced driving and driven process blocks into a new process block further comprising determining the order of the replaced process blocks that are specified in the ESL/HDL source files, and the order of process block execution as obtained in claim 10 step (c), and if the order of execution of process blocks is the same as they are specified in the ESL/HDL source files, the new process block will contain the ESL/HDL code of the replaced driving and driven process blocks, in the same order as those process blocks are specified in the ESL/HDL source files, and if the execution of process blocks is in the reverse order as they are specified in the ESL/HDL source files, then the new process block contains the ESL/HDL code of the replaced driving and driven process blocks, in the reverse order as those process blocks are specified in the ESL/HDL source files.

17. The method of claim 16 further comprising the step of adding a controlling expression for the ESL/HDL code from a replaced process block when the code is copied to the new process block when a replaced process block is triggered by a positive-edge (or negative-edge) of a trigger signal, wherein the new process block is triggered by any-edge of that trigger signal, wherein the controlling condition consists of the trigger signal's value equals logic '1' (or logic '0') in order for the copied ESL/HDL code to be executed when the new process block is active, and if there are multiple trigger signals in a controlling condition, the trigger signals' asserted states are logically OR'ed together to form a new controlling expression.

18. A computer-implemented method for performing race logic synthesis on an ESL (electronic system level)-based IC (integrated circuit) design, comprises using computer to perform one or more of the following steps:
   (a) Compiling, by computer, an IC design source files, coded in any one or a combination of ESL and any HDL (hardware description language) design languages, into a design database;
   (b) Performing static and/or dynamic race logic analysis of the IC design, either by a host application, or by an external race logic audit tool, or the combination of both;
   (c) Determining the execution order of process blocks of the IC design in the design database, using the default process block execution order by the host application and/or obtaining that order from user;
   (d) Executing the race logic synthesis functions to get rid of all race logic, as detected in (b), in the compiled IC design database;
   (e) As a user-specified option or a default action of the host application, generating updated ESL/HDL source files for the IC design, where race logic has been remedied by the race logic synthesis functions in (d);
wherein step (d) comprises:
   (f) For each IPC object, including but not limited to a dynamic queue, that has been identified as having concurrent delete race logic issue, as detected in step (b), collecting the driving factors for each driving process block of the IPC object;
   (g) Collecting all driving process blocks of the IPC object that have one or more driving factors that are compatible;
   (h) Replacing all driving process blocks that have compatible driving factors by one single process block, so as to impose a deterministic delete order to the IPC object in the merged process block.

19. The method of claim 18 wherein the operation of (g) further comprises the step of collecting the driving factors for each driving process block of an IPC object, wherein the driving factors comprise: triggering signals to the process block; a trigger event type; possible delays in deleting data from the IPC; the delete location of the IPC object; possible enabling conditions which control the delete event.

20. The method of claim 18 wherein the operation of (h) further comprises checking if any two sets of driving factors for two driving process blocks of an IPC object are compatible simultaneously, wherein the two sets of driving factors are compatible if they contain one or more the same trigger signals that are triggered by compatible event types, and the IPC object could be deleted by multiple processes, at the same location of the IPC object and at the same time, when the triggered signals are active.

21. The method of claim 20 wherein the trigger event types of a trigger signal in two sets of driving factors are compatible if they are of the same event type (positive-edge, negative-edge or any-edge), one is positive-edge and the other is any-edge or one is negative-edge and the other is any-edge.

22. The method of claim 18 wherein the operation of (h) further comprises replacing all the driving process blocks that are found to have compatible driving factors by a new driving process block, wherein the new driving process block will contain all the ESL/HDL code of the replaced driving process blocks, and the new driving process block will be triggered by new driving factors.

23. The method of claim 22 further comprising the step of creating new driving factors for the newly created driving process block for an IPC object, wherein the new driving factors will contain the union of all the triggered signals in the driving factors of the replaced process blocks, and if the trigger event types of a trigger signal in the replaced driving factors are the same (e.g., all are positive-edge trigger, all are negative-edge trigger, or all are any-edge trigger), then using the same trigger event type for the trigger signal in the new driving factors, and if the trigger event types of a trigger signal in the replaced driving factors are not the same, then using the any-edge trigger event type for the trigger signal in the new driving factors.

24. The method of claim 23 further comprising the step of merging all ESL/HDL code of the replaced driving process blocks into a new driving process block further comprising determining the order of the replaced driving process blocks that are specified in the ESL/HDL source files, and the orders of process block execution in claim 18 step (c) and if the order of execution of process blocks is the same as they are specified in the ESL/HDL source files, the new driving process block contains the ESL/HDL code of the replaced process blocks, in the same order as they are specified in the ESL/HDL source files, and if the execution of process blocks is in the reverse order as specified in the ESL/HDL source files, then the new driving process block contains the ESL/HDL code of the replaced process blocks, in the reverse order as those process blocks are specified in the ESL/HDL source files.

25. The method of claim 24 further comprising the step of adding a controlling expression for the ESL/HDL code from a replaced process block when the code is copied to the new driving process block when a replaced driving process block is triggered by a positive-edge (or negative-edge) of a trigger signal, wherein the new driving process block is triggered by any-edge of that trigger signal, wherein the controlling condition consists of the trigger signal's value equals logic '1' (or logic '0') for the copied ESL/HDL code to be executed when the new driving process block is active, and if there are multiple trigger signals in the controlling condition, the trigger signals' asserted states are logically OR'ed together to form a new controlling expression.

26. A computer-implemented method for performing race logic synthesis on an ESL (electronic system level)-based IC (integrated circuit) design, comprises using a computer to perform one or more of the following steps:

(a) Compiling, by computer, an IC design source files, coded in any one or a combination of ESL and any HDL (hardware description language) design languages, into a design database;

(b) Performing static and/or dynamic race logic analysis of the IC design, either by a host application, or by an external race logic audit tool, or the combination of both;

(c) Determining the execution order of process blocks of the IC design in the design database, using the default process block execution order by the host application and/or obtaining that order from user;

(d) Executing the race logic synthesis functions to get rid of all race logic, as detected in (b), in the compiled IC design database;

(e) As a user-specified option or a default action of the host application, generating updated ESL/HDL source files for the IC design, where race logic has been remedied by the race logic synthesis functions in (d);

wherein step (d) comprises:

(f) Examining each IPC object, including not limited to a FIFO (first-in-first-out) buffer and a mailbox, that is identified, as according to step (b), as having concurrent reference (read) race issue, and collecting the driving factors for each driven process block of the IPC object;

(g) Collecting all driven process blocks for the IPC object that have one or more driving factors that are compatible; and (h) Replacing all those driven process blocks that have compatible driving factors by a new process block, so as to impose a deterministic reference (read) order of the IPC object in the new process block.

27. The method of claim 26 wherein the operation of (f) further comprises collecting the driving factors for each driven process block of the IPC object, wherein the driving factors comprise: triggering signals to the process block; a trigger event type; possible delays in reading from the IPC object;

possible enabling conditions which control the read operation.

28. The method of claim 26 wherein the operation of (g) further comprises checking if any two sets of driving factors for two driven process blocks of the IPC object are compatible simultaneously, wherein two sets of driving factors are compatible if they contain one or more the same trigger signals that are triggered by compatible event types, and the IPC object could be read by those two process blocks at the same time, when the triggered signals are active.

29. The method of claim 28 wherein the trigger event types of a trigger signal in two driving factors are compatible if they are of the same event type (positive-edge, negative-edge or any-edge), one is positive-edge and the other is any-edge or one is negative-edge and the other is any-edge.

30. The method of claim 26 wherein the operation of (h) further comprises replacing all the driven process blocks that are found to have compatible driving factors by a new process block, wherein the new process block will contain all the ESL/HDL code of the replaced process blocks, and the new process block will be triggered by new driving factors.

31. The method of claim 30 further comprising the step of creating new driving factors for the newly created process block for the IPC object, wherein the new driving factors contain all the triggered signals in the driving factors of the replaced process blocks, and if the trigger event types of a trigger signal in the replaced driving factors are the same, then using the same trigger event type for the trigger signal in the new driving factors, and if the trigger event types of a trigger signal in the replaced driving factors are not the same, then using the any-edge trigger event type for the trigger signal in the new driving factors.

32. The method of claim 31 further comprising the step of merging all ESL/HDL code of the replaced process blocks into the new process block by determining the order of appearance of the replaced process blocks as specified in the ESL/HDL source files, and the order of process blocks execution as in claim 26 step (c), and if the order of execution of process blocks is the same as they are specified in the ESL/HDL source files, the new process block contains the ESL/HDL code of the replaced process blocks, in the same order as those process blocks are specified in the ESL/HDL source files, and if the execution of process blocks is in the reverse order as they are specified in the ESL/HDL source files, then the new process block contains the ESL/HDL code of the replaced process blocks, in the reverse order as those process blocks are specified in the ESL/HDL source files.

33. The method of claim 32 further comprising the step of adding a controlling expression for the ESL/HDL code from a replaced process block when the code is copied to the new process block when a replaced process block is triggered by a positive-edge (or negative-edge) of a trigger signal, wherein the new process block is triggered by any-edge of that trigger signal, wherein the controlling condition will consist of the trigger signal's value equals logic '1' (or logic '0') in order for the copied ESL/HDL code to be executed when the new process block is active, wherein if there are multiple trigger signals in a controlling condition, the trigger signals' asserted states are logically OR'ed together to form a new controlling expression.

34. A computer-implemented method for performing race logic synthesis on an ESL (electronic system level)-based IC (integrated circuit) design, comprises using a computer to perform one or more of the following steps:

(a) Compiling, by computer, an IC design source files, coded in any one or a combination of ESL and any HDL (hardware description language) design languages, into a design database;

(b) Performing static and/or dynamic race logic analysis of the IC design, either by a host application, or by an external race logic audit tool, or the combination of both;

(c) Determining the execution order of process blocks of the IC design in the design database, using the default process block execution order by the host application and/or obtaining that order from user;

(d) Executing the race logic synthesis functions to get rid of all race logic, as detected in (b), in the compiled IC design database;

(e) As a user-specified option or a default action of the host application, generating updated ESL/HDL source files for the IC design, where race logic has been remedied by the race logic synthesis functions in (d);

wherein step (d) comprises:

(f) Examining each IPS object, including not limited to a semaphore and a mutex (mutually exclusive lock), that is identified, as according to step (b), as having concurrent locking race logic, and collecting the driving factors for each driving process block (which performs a lock operation) of the IPS object;

(g) Collecting all driving process blocks for the IPS object that have one or more driving factors that are compatible; and (h) Replacing all those driving process blocks that have compatible driving factors by a new process block, so as to impose a deterministic locking order of the IPS object in the new process block.

35. The method of claim 34 wherein the operation of (f) further comprises collecting the driving factors for each driving process block of the IPS object, wherein the driving factors comprise: triggering signals to the process block; a trigger event type; possible delays in performing the locking operation on the IPS object; possible enabling conditions which control the lock operation.

36. The method of claim 34 wherein the operation of (g) further comprises checking if any two sets of driving factors for two driving process blocks of the IPS object are compatible simultaneously, wherein two sets of driving factors are compatible if they contain one or more the same trigger signals that are triggered by compatible event types, and the lock operations (blocking and/or non-blocking) can be performed concurrently on the IPS object, when the triggered signals are active.

37. The method of claim 36 wherein the trigger event types of a trigger signal in two driving factors are compatible if they are of the same event type (positive-edge, negative-edge or any-edge), one is positive-edge and the other is any-edge or one is negative-edge and the other is any-edge.

38. The method of claim 34 wherein the operation of (h) further comprises replacing all the driving process blocks that are found to have compatible driving factors by a new process block, wherein the new process block will contain all the ESL/HDL code of the replaced process blocks, and the new process block will be triggered by new driving factors.

39. The method of claim 38 further comprising the step of creating new driving factors for the newly created process block for the IPS object, wherein the new driving factors contain all the triggered signals in the driving factors of the replaced process blocks, and if the trigger event types of a trigger signal in the replaced driving factors are the same, then using the same trigger event type for the trigger signal in the new driving factors, and if the trigger event types of a trigger signal in the replaced driving factors are not the same, then using the any-edge trigger event type for the trigger signal in the new driving factors.

40. The method of claim 39 further comprising the step of merging all ESL/HDL code of the replaced process blocks into the new process block by determining the order of appearance of the replaced process blocks as specified in the ESL/HDL source files, and the order of process blocks execution as in claim 34 step (c), and if the order of execution of process blocks is the same as they are specified in the ESL/HDL source files, the new process block contains the ESL/HDL code of the replaced process blocks, in the same order as those process blocks are specified in the ESL/HDL source files, and if the execution of process blocks is in the reverse order as they are specified in the ESL/HDL source files, then the new process block contains the ESL/HDL code of the replaced process blocks, in the reverse order as those process blocks are specified in the ESL/HDL source files.

41. The method of claim 40 further comprising the step of adding a controlling expression for the ESL/HDL code from a replaced process block when the code is copied to the new process block when a replaced process block is triggered by a positive-edge (or negative-edge) of a trigger signal, wherein the new process block is triggered by any-edge of that trigger signal, wherein the controlling condition will consist of the trigger signal's value equals logic '1' (or logic '0') in order for the copied ESL/HDL code to be executed when the new process block is active, wherein if there are multiple trigger signals in a controlling condition, the trigger signals' asserted states are logically OR'ed together to form a new controlling expression.

* * * * *